US006881981B2

United States Patent
Tsuda et al.

(10) Patent No.: US 6,881,981 B2
(45) Date of Patent: Apr. 19, 2005

(54) NITRIDE SEMICONDUCTOR LIGHT EMITTING DEVICE CHIP

(75) Inventors: Yuhzoh Tsuda, Tenri (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 102 days.

(21) Appl. No.: 10/250,617

(22) PCT Filed: Dec. 27, 2001

(86) PCT No.: PCT/JP01/11605

§ 371 (c)(1),
(2), (4) Date: Jul. 3, 2003

(87) PCT Pub. No.: WO02/056434

PCT Pub. Date: Jul. 18, 2002

(65) Prior Publication Data

US 2004/0056261 A1 Mar. 25, 2004

(30) Foreign Application Priority Data

Jan. 4, 2001 (JP) .................................... 2001-000069
Feb. 27, 2001 (JP) .................................... 2001-052175

(51) Int. Cl.[7] .............................................. H01L 33/00
(52) U.S. Cl. ............................ 257/88; 257/79; 438/30; 438/46
(58) Field of Search ...................... 257/79, 88; 438/30, 438/46

(56) References Cited

FOREIGN PATENT DOCUMENTS

| JP | 08-064870 | 3/1996 |
| JP | 2000-021789 | 1/2000 |
| JP | 2000-183462 | 6/2000 |

OTHER PUBLICATIONS

Shin–ichi Nagahama et al., Jpn. J. Appl. Phys., vol. 39 (2000), "High–Power and Long–Lifetime InGaN Multi-–Quantum–Well Laser Diodes Grown On Low–Dislocation–Density GaN Substrates" Part 2, No. 7A, Jul. 1, 2000, pp L647–L650.

Primary Examiner—Zamir Zararian
Assistant Examiner—Kiesha Rose
(74) Attorney, Agent, or Firm—Morrison & Foerster LLP

(57) ABSTRACT

In a nitride semiconductor light emitting device chip, a mask pattern on a nitride semiconductor substrate (101) is formed of a growth inhibiting film on which a nitride semiconductor layer is hard to grow. There are a plurality of windows unprovided with the growth inhibiting film. There are at least two different widths as mask widths each between the adjacent windows. The mask pattern includes a mask A group (MAG) and mask B groups (MBG) arranged on respective sides of the mask A group. A mask A width in the mask A group is wider than a mask B width in the mask B group. The nitride semiconductor light emitting device chip further includes a nitride semiconductor underlayer (102) covering the windows and the mask pattern, and a light emitting device structure having a light emitting layer (106) including at least one quantum well layer between an n type layer (103–105) and a p type layer (107–110) over the underlayer. A current-constricting portion (RS) through which substantial current is introduced into the light emitting layer is formed above mask A.

24 Claims, 13 Drawing Sheets

MP  MAG  MP

MP  MAG  MP

MP  MAG  MP

NITRIDE SEMICONDUCTOR LIGHT EMITTING DEVICE CHIP

CROSS-REFERENCE TO RELATED APPLICATIONS

This application is a National Phase under 35 U.S.C. § 371 of International Application No. PCT/JP01/11605 filed on Dec. 27, 2001 which claims priority to Japanese Patent Application No. 2001-000069 filed on Jan. 4, 2001, and Japanese Patent Application No. 2001-052175 filed on Feb. 27, 2001, the contents of each of which are incorporated herein by reference in their entirety.

TECHNICAL FIELD

The present invention relates to nitride semiconductor light emitting devices, and more particularly to improvement in their light-emitting lifetimes, luminous intensities, operating voltages and yields.

BACKGROUND ART

Jpn. J. Appl. Phys., Vol. 39 (2000), pp. L647–650 teaches a way of improving an output and a lifetime of a nitride semiconductor laser device, wherein a GaN underlayer is grown to cover a mask pattern of uniform $SiO_2$ stripes formed over an entire region of one main surface of a GaN substrate and windows unprovided with the $SiO_2$ masks, and the nitride semiconductor laser device is formed on the GaN underlayer.

According to the article, threading dislocations in the GaN underlayer decrease in a region above the $SiO_2$ mask, and then the output and the lifetime of the laser device can be improved by utilizing the underlayer region having such a small threading dislocation density.

However, it is still desired to improve the lasing lifetime even in the nitride semiconductor laser device disclosed in the above-described article Jpn. J. Appl. Phys., Vol. 39 (2000), pp. L647–650.

Incidentally, there are different two ways to provide a pair of electrodes to a semiconductor laser chip. In the first way, two electrodes (a p-side electrode and an n-side electrode) opposite to each other are provided on a front side of a semiconductor laser device structure formed on a substrate and on a back side of the substrate, respectively. Hereinafter, such an arrangement of electrodes is called "counter electrodes arrangement". In the second way, a p-side electrode (or an n-side electrode) is provided on a front side of a semiconductor laser device structure formed on a substrate, and a portion of an n type layer (or a p type layer) is exposed by reactive ion etching on the front side of the device structure to provide an n-side electrode (or a p-side electrode) on the exposed region. That is, both the p-side electrode and the n-side electrode are provided on the same side of the substrate. Hereinafter, such an arrangement of electrodes is called "one-side electrodes arrangement".

In comparison between the counter electrodes arrangement and the one-side electrodes arrangement, while it is necessary to secure both the regions for forming the p-side and n-side electrodes on the front side of the substrate in the one-side electrodes arrangement, the back side of the substrate can be used as the electrode formation region in the counter electrodes arrangement. That is, in the laser chip having the counter electrodes arrangement, the substrate area can be used more efficiently, allowing reduction of the chip size. Although formation of a laser chip having the one-side electrodes arrangement requires reactive ion etching of a portion of the semiconductor laser device structure, such a complicated process is unnecessary to form a laser chip having the counter electrodes arrangement.

In the nitride-based semiconductor laser device having the counter electrodes arrangement, however, its threshold voltage is liable to increase considerably compared to the case of the laser device having the one-side electrodes arrangement. Thus, it is common to employ the one-side electrodes arrangement in a semiconductor laser device.

Under these circumstances, it is also desired to decrease the threshold voltage of the semiconductor laser device having the counter electrodes arrangement in order to promote utilization of the semiconductor laser device with the counter electrodes arrangement which has the advantages of reduced chip size and simplified manufacturing process.

In view of the foregoing, a primary object of the present invention is to further improve nitride semiconductor light emitting devices in their light-emitting lifetimes, luminous intensities, yields and others. Another object of the present invention is to further improve nitride semiconductor laser devices having the counter electrodes arrangement in their threshold voltages and others.

DISCLOSURE OF THE INVENTION

A nitride semiconductor light emitting device chip according to an aspect of the present invention includes a mask substrate including a mask pattern formed on a main surface of a nitride semiconductor substrate. The mask pattern is formed of a growth inhibiting film which suppresses epitaxial growth of a nitride semiconductor layer thereon, and there are a plurality of windows unprovided with the growth inhibiting film. There are at least two different widths of masks each between the windows adjacent to each other, and the mask pattern includes a mask A group and mask B groups. The mask B groups are arranged on respective sides of the mask A group, and a mask A width in the mask A group is set wider than a mask B width in the mask B group. The nitride semiconductor light emitting device chip further includes a nitride semiconductor underlayer covering the windows and the mask pattern, and a light emitting device structure having a light emitting layer including a quantum well layer (or a quantum well layer and a barrier layer in contact with the quantum well layer) between an n type layer and a p type layer over the underlayer. A current-constricting portions through which substantial electric current is introduced into the light emitting layer is formed above mask A.

The current-constricting portion is preferably formed more than 2 $\mu$m away from the center of the width of mask A. Further, the current-constricting portion is preferably formed above a region across mask A and window A. Still further, the current-constricting portion is preferably included completely in a region right above mask A.

A window A width in the region of the mask A group is preferably set narrower than a window B width in the region of the mask B group. The mask A width is preferably in a range of 10–20 $\mu$m, and the window A width is preferably in a range of 2–10 $\mu$m. The mask B width is preferably in a range of 2–10 $\mu$m, and the window B width is preferably in a range of 5–40 $\mu$m. Mask A is preferably formed in a stripe shape having its longitudinal direction parallel to either a <1-100> direction or a <11-20> direction of the nitride semiconductor substrate.

The nitride semiconductor underlayer preferably includes $Al_xGa_{1-x}N$ ($0.1 \leq x \leq 0.15$) or $In_xGa_{1-x}N$ ($0.1 \leq x \leq 0.18$). Further, the quantum well layer preferably contains at least one of As, P and Sb.

A nitride semiconductor laser chip according to another aspect of the present invention includes a mask substrate including a mask group formed on a region of a main surface of a nitride semiconductor substrate having a polarity of n type or p type. The mask group includes a plurality of masks and a plurality of windows arranged alternately with each other. Each of the masks is formed of a growth inhibiting film suppressing epitaxial growth of a nitride semiconductor layer thereon, and each of the windows is unprovided with the growth inhibiting film. The nitride semiconductor laser chip further includes a nitride semiconductor underlayer having a polarity and covering an entire region including the mask group over the mask substrate, and a light emitting device structure having a light emitting layer including a quantum well layer (or a quantum well layer and a barrier layer in contact with the quantum well layer) between an n type layer and a p type layer over the underlayer. A current-constricting portion through which substantial electric current is introduced into the light emitting layer is formed above the mask group, and electrodes are formed on a back side of the mask substrate and a front side of the light emitting device structure, respectively.

In the width direction orthogonal to the length direction of a resonator of the laser chip, the width of the mask group is preferably less than 50% of the width of the laser chip. Further, the mask preferably has a width in a range of 10–20 $\mu$m, and the window preferably has a width in a range of 2–10 $\mu$m.

The nitride semiconductor underlayer preferably includes $Al_xGa_{1-x}N$ (0.01≦x≦0.15) or $In_xGa_{1-x}N$ (0.01≦x≦0.18). Further, the quantum well layer preferably contains one of As, P and Sb.

The nitride semiconductor light emitting device chips of the present invention as describe above can favorably be used in optical apparatuses and light emitting apparatuses.

BRIEF DESCRIPTION OF THE DRAWINGS

FIGS. 9A–9C are top plan views of mask substrates usable in the present invention, among which FIG. 9A shows a mask substrate where a mask pattern including stripes in two directions orthogonal to each other is arranged at each side of a mask group A, FIG. 9B shows a mask substrate where a mask pattern including stripes in two directions at 60 degrees with each other is arranged at each side of a mask group A, and FIG. 9C shows a mask substrate where a mask pattern including stripes in three directions at 60 degrees with each other is arranged at each side of a mask group A.

Figure 1:
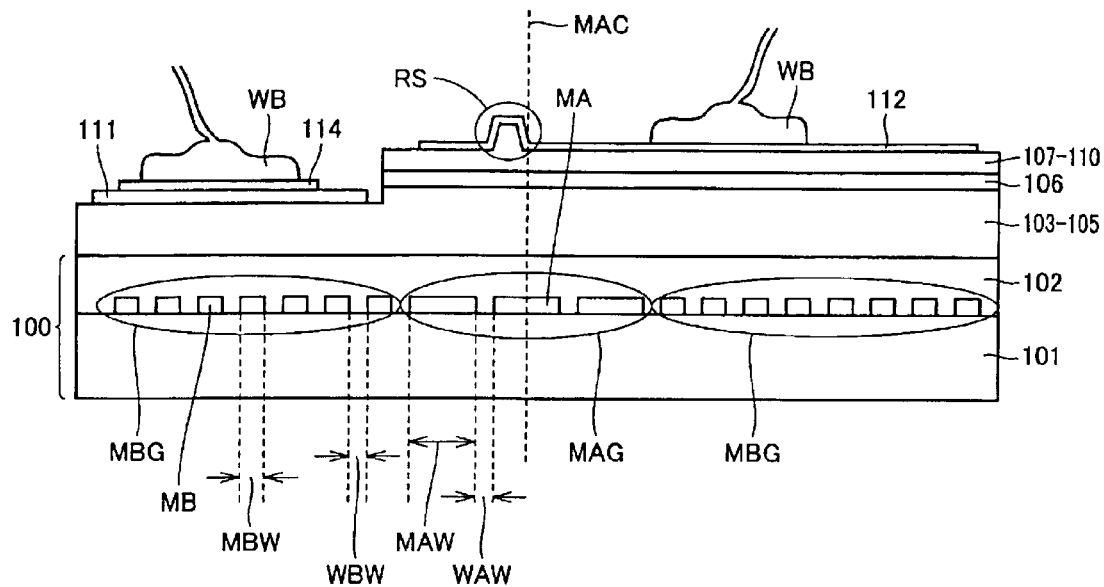
FIG. 1 is a schematic cross sectional view illustrating an example of a nitride semiconductor laser device chip according to the present invention.

In the drawings of the present application, the same or corresponding portions are denoted by the same reference characters. In the drawings of the present application, the dimensional relationships in length, width, thickness and others are arbitrarily changed for the purposes of clarification and simplification of the drawings, rather than showing the actual dimensional relationships.

BEST MODES FOR CARRYING OUT THE INVENTION

Hereinafter, several terms are defined before description of various embodiments of the present invention.

A "nitride semiconductor substrate" refers to a substrate including $Al_xGa_yIn_zN$ (0≦x≦1; 0≦y≦1; 0≦z≦1; x+y+z=1), wherein less than about 10% of the nitrogen element included in the nitride semiconductor substrate may be substituted with at least one of As, P and Sb (provided that the hexagonal crystal system of the substrate is maintained). Further, the nitride semiconductor substrate may be doped with at least one impurity selected from Si, O, Cl, S, C, Ge, Zn, Cd, Mg and Be.

A "nitride semiconductor substrate having a polarity" refers to a nitride semiconductor substrate which has a polarity of n type or p type.

A "mask group" refers to a region where a plurality of masks formed of growth inhibiting films and a plurality of windows are arranged alternately.

A "growth inhibiting film" refers to a film on which epitaxial growth of a nitride semiconductor layer is unlikely to occur. For example, the growth inhibiting film can be formed with a dielectric film, more specifically with $SiO_2$, $SiN_x$, $Al_2O_3$ or $TiO_2$.

A "window" refers to a portion where an underlayer is exposed, not covered with a mask pattern formed of growth inhibiting films.

Figure 6A:
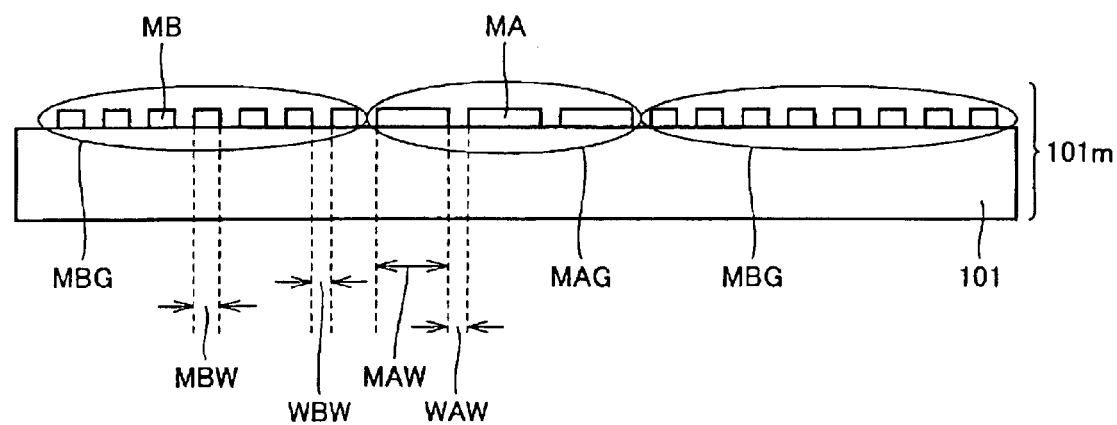
FIG. 6A is a schematic cross sectional view illustrating a mask substrate usable in the present invention.
Figure 11:
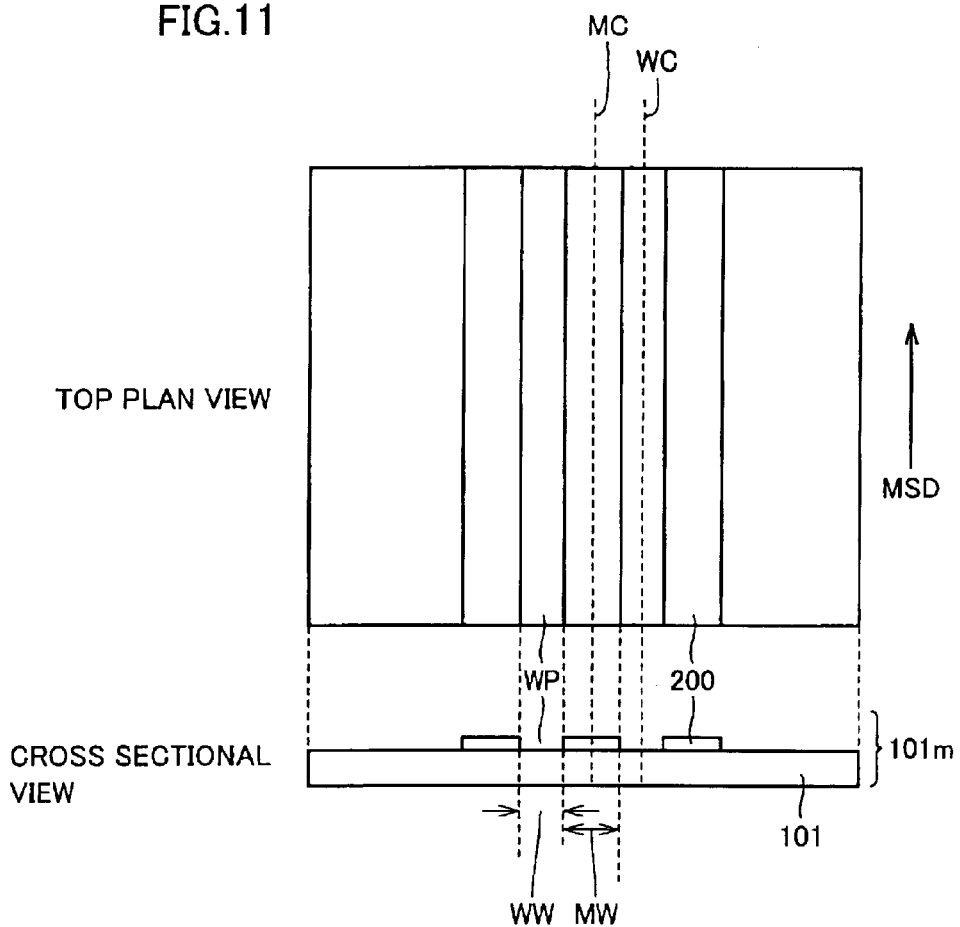
FIG. 11 is a schematic diagram illustrating an upper surface and a cross section of a mask substrate usable in the present invention.

A "mask substrate" refers to a substrate where a mask pattern of growth inhibiting films is formed on at least a partial region of a main surface of a nitride semiconductor substrate (see FIGS. 6A and 11).

A "nitride semiconductor underlayer" refers to a nitride semiconductor film which covers an entire region including the mask group(s) over the mask substrate and includes $Al_xGa_yIn_zN$ ($0 \leq x \leq 1$; $0 \leq y \leq 1$; $0 \leq z \leq 1$; x+y+z=1). Similarly as in the case of the nitride semiconductor substrate, less than about 10% of the nitrogen element included in the nitride semiconductor underlayer may be substituted with at least one of As, P and Sb. Further, the underlayer may be doped with at least one impurity selected from Si, O, Cl, S, C, Ge, Zn, Cd, Mg and Be.

Figure 6B:
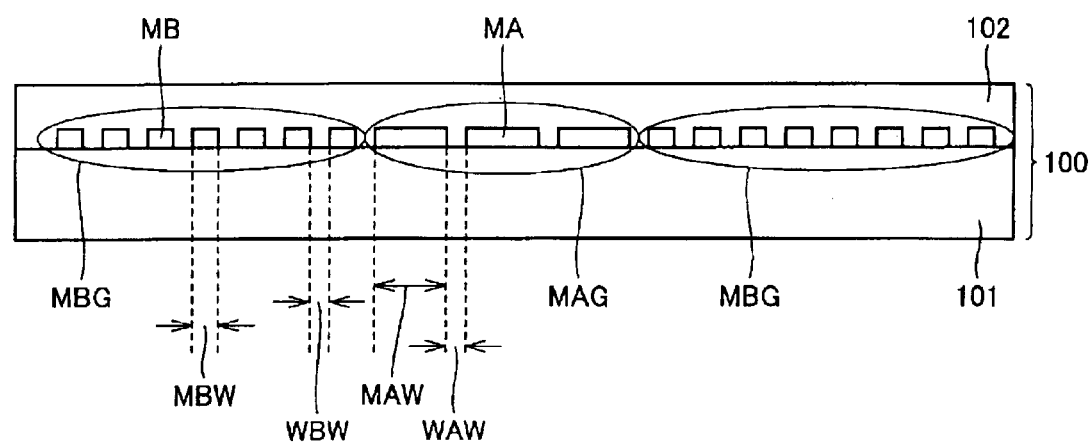
FIG. 6B is a schematic cross sectional view illustrating a filmed mask substrate formed from the mask substrate of FIG. 6A.
Figure 12:
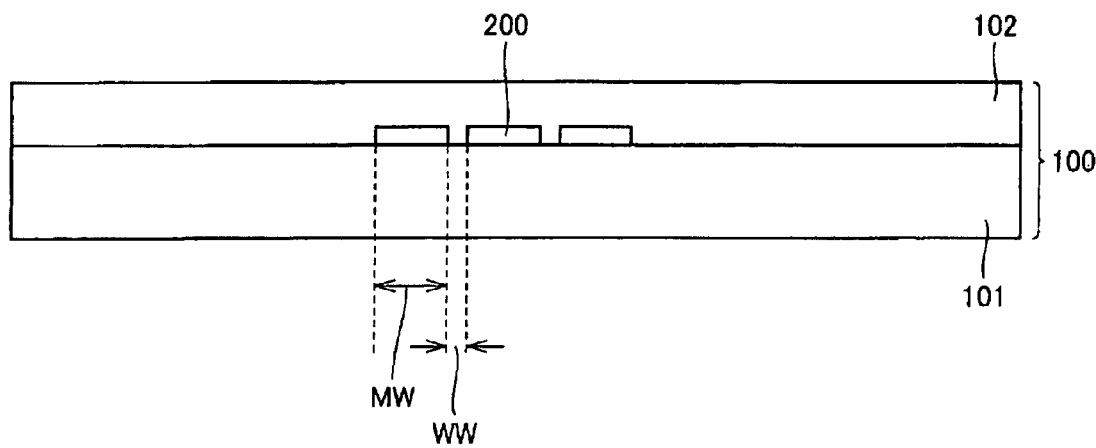
FIG. 12 is a schematic cross sectional view illustrating a filmed mask substrate usable in the present invention.

A "filmed mask substrate" refers to an improved substrate which includes a nitride semiconductor underlayer covering an entire region including the mask group(s) over the mask substrate (see FIGS. 6B and 12).

A "light emitting layer" refers to a layer which includes at least one quantum well layer or a plurality of barrier layers stacked alternately with the quantum well layers and which can emit light. The light emitting layer of a single quantum well structure is formed of only a single well layer or formed of stacked layers of barrier layer/well layer/barrier layer. The light emitting layer of a multiple quantum well structure of course includes a plurality of well layers and a plurality of barrier layers stacked alternately with each other.

A "light emitting device structure" refers to a structure which includes, in addition to a light emitting layer, an n type layer(s) and a p type layer(s) sandwiching the light emitting layer.

Figure 8A:
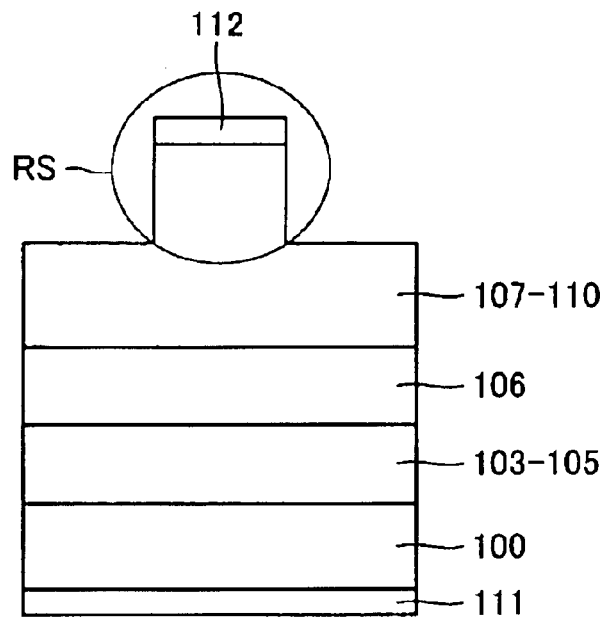
FIG. 8A is a schematic cross sectional view illustrating a nitride semiconductor laser device chip having a ridge stripe structure.

A "current-constricting portion" refers to a portion through which substantial electric current is introduced into a light emitting layer via a p type layer or an n type layer, and a "current-constricting width" refers to a width of the relevant portion. In the case of a semiconductor laser having a ridge stripe structure, for example, the current-constricting portion corresponds to a ridge stripe portion (RS) shown in FIG. 8A, and the current-constricting width corresponds to a ridge stripe width. In the case of a semiconductor laser having a current-constricting layer, the current-constricting portion corresponds to a portion (CS) sandwiched between two current-blocking layers (CB) shown in FIG. 8B, and the current-constricting width corresponds to a width between the current-blocking layers.

[First Embodiment]

In the present invention, a nitride semiconductor light emitting device structure is formed on a nitride semiconductor underlayer which covers a mask substrate having masks of growth inhibiting films and windows uncovered with the mask over a nitride semiconductor substrate. A mask width and/or a window width is changed appropriately within one nitride semiconductor device, so that it becomes possible to provide a nitride semiconductor light emitting device improved in its light-emitting lifetime, luminous intensity and others, and to suppress cracks liable to occur in the light emitting device.

The effects of the present invention by changing the mask width and/or the window width appropriately in one nitride semiconductor light emitting device chip can be obtained only in the case that a substrate included in the mask substrate is a nitride semiconductor. A nitride semiconductor underlayer grown on a mask substrate including a substrate other than the nitride semiconductor substrate (hereinafter, referred to as a "non-nitride substrate") suffers strong stressed strain compared to the case of using the nitride semiconductor substrate, since difference in thermal expansion coefficient between the non-nitride substrate and the nitride semiconductor underlayer is considerably greater than that between the nitride semiconductor substrate and the nitride semiconductor underlayer. As such, in the case that the nitride semiconductor substrate is replaced with a non-nitride substrate, even if the mask and the window are formed with appropriate widths according to the present invention, crystal strain within the nitride semiconductor film (including the light emitting device structure formed on the nitride semiconductor underlayer) covering the mask substrate is not similarly alleviated as in the case of the present invention. In addition, the effect of suppressing cracks which improves yield of the light emitting devices, the effect of reducing the threshold current density and the effect of reducing the threshold voltage are not similarly expected as in the case of the present invention.

(Varied Mask Widths)

The effect of varying the mask widths is described with reference to the schematic cross section of FIG. 1. In the nitride semiconductor laser device shown in this figure, a mask A group (MAG) including periodically provided stripe masks A (MA) of growth inhibiting masks and a mask B group (MBG) including a plurality of similar masks B (MB) are formed on a nitride semiconductor substrate 101. An underlayer 102 of a nitride semiconductor film, n type layers 103–105, a light emitting layer 106, and p type layers 107–110 are successively crystal-grown to cover the mask groups. The mask B groups are formed on respective sides of the mask A group, and a ridge stripe portion (RS) of the laser device is formed above mask A (MA). Herein, a width of the window between adjacent masks A is called a window A width (WAW), and a width of the window between adjacent masks B is called a window B width (WBW).

In FIG. 1, the window A width and the window B width were set equal to each other to study the effect of varied mask widths. The mask B width was set narrower than the mask A width. The nitride semiconductor laser device of FIG. 1 can be produced in a similar manner as will be described later in the second embodiment.

According to a result of the inventors' study, lasing lifetime tended to extend in the case that the ridge stripe portion of the nitride semiconductor laser device was formed above one mask A and that the center line (MAC in FIG. 1) of the mask A width did not cross the ridge stripe portion (RS). More detailed investigation revealed that the lasing lifetime began to extend remarkably when the ridge stripe portion was formed above mask A and then a distance from the center line of the mask A to a closer side edge of the ridge stripe portion became more than about 2 μm. In particular, the lasing lifetime became the longest in the case that the ridge stripe portion was completely included within the region above mask A, and the lasing lifetime was improved even in the case that the ridge stripe portion was formed above a region crossing the boundary between mask A and window A. The latter case is preferable in that the threshold current density is decreased by about some %. It is considered that the lasing lifetime extends because crystal strain of the nitride semiconductor layer is alleviated above the mask than above the window.

From the standpoint of a long lasing lifetime, the mask A width (MAW) is preferably more than 10 μm and less than 20 μm, and more preferably more than 13 μm and less than 20 μm. If the mask A width is less than 10 μm, considerable elongation of the lasing lifetime may not be expected. When the mask A width becomes more than 13 μm, the lasing lifetime begins to extend remarkably (e.g., the lasing lifetime becomes more than about 15000 hours with laser output of 30 mW at an ambient temperature of 60° C.). On the other hand, the lasing lifetime began to decrease gradually when the mask A width exceeded 20 μm, presumably because of the following reason. When the mask width is within the range from 10 μm to 20 μm, the crystallographic axis of the nitride semiconductor layer above the mask is essentially somewhat inclined with respect to a direction perpendicular to the main surface of the substrate. When the mask width exceeds 20 μm, the inclination of the crystallographic axis becomes so large that it cannot be neglected with respect to lasing. In addition, when the mask width exceeds 20 μm, lateral crystal growth above the mask becomes insufficient, leading to formation of a void above the center of the mask width.

In view of the result of the study regarding the mask A width as described above, only the mask A group having a mask A width set within the range of 10–20 μm was formed on the nitride semiconductor substrate, and a nitride semiconductor laser device was formed using the same. With such a nitride semiconductor laser device, however, the rate of defective devices was high. The inventors found, through detailed examination of the defective device chip, that many cracks occurred across the ridge stripe portion.

Conventionally, it has been considered that cracks hardly occur in a nitride semiconductor laser device when it is formed on a GaN substrate. When only the mask A group was practically formed on a GaN substrate and a nitride semiconductor laser device was grown on a nitride semiconductor underlayer covering the mask A group, however, many cracks occurred in the laser device. This is presumably because the nitride semiconductor laser device is formed of a stacked structure of various kinds of layers (e.g., an AlGaN layer has a small lattice constant compared to that of a GaN layer, and an InGaN layer has a large lattice constant compared to that of the GaN layer). Another conceivable reason is that a GaN substrate obtained by currently available technique has latent residual strain in itself.

In view of the foregoing, in the present embodiment, the mask B groups are arranged on respective sides of the mask A group that is arranged approximately beneath the ridge stripe portion. Here, the mask B group on the either side of the mask A group is provided within the same nitride semiconductor laser device chip (see FIG. 1), and the mask B width is set narrower than the mask A width. By doing so, it is possible to realize a long lasing lifetime as well as to suppress occurrence of cracks across the ridge stripe portion.

The crack suppressing effect of the present embodiment is explained in detail with reference to FIG. 2. In this figure, a filmed mask substrate 100 is shown in top plan view and in side view, where a mask A group (MAG) and mask B groups (MBG) are formed on a nitride semiconductor substrate 101, and an underlayer 102 of nitride semiconductor film is crystal-grown to cover the mask groups. Here, the mask B groups are arranged on respective sides of the mask A group, and the mask B width (MBW) is set narrower than the mask A width (MAW). Masks MB1, MB2 and MB3 shown in FIG. 2 belong to the mask B group, which are numbered for convenience of the explanation. Further, a region A shown in FIG. 2 illustrates a range of the nitride semiconductor underlayer stacked above the mask A group.

Figure 2:
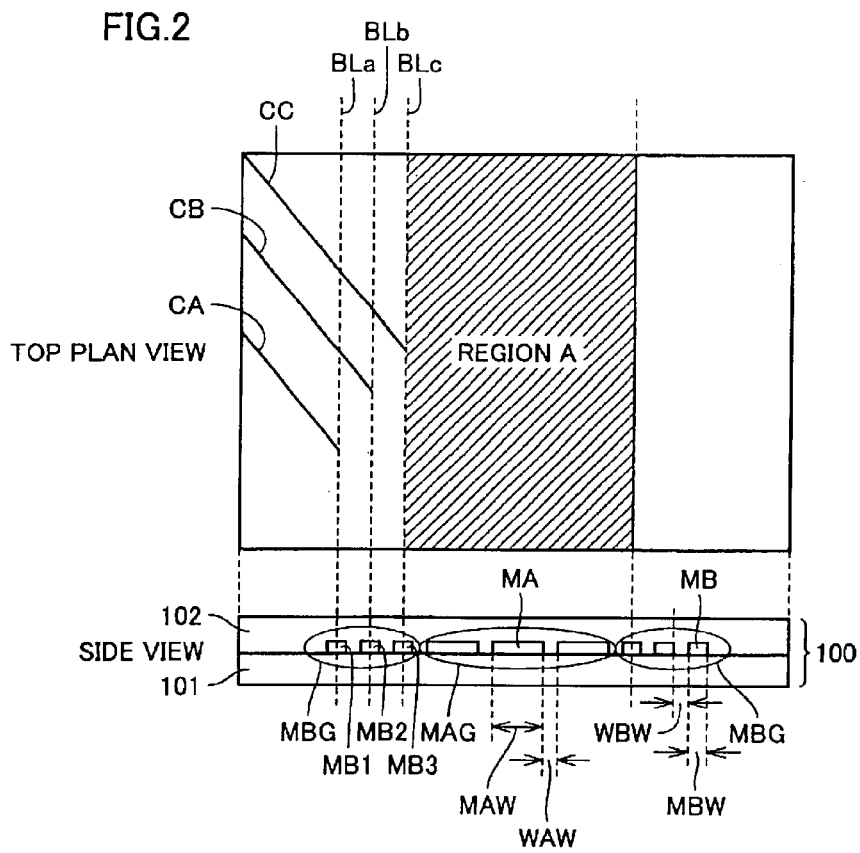
FIG. 2 is a schematic diagram showing an upper surface and a side surface of a filmed mask substrate usable in the present invention.

Referring to FIG. 2, progress of a crack CA having occurred at the surface of the nitride semiconductor underlayer was blocked approximately above the center of the width of mask MB1 (broken line BLa in FIG. 2). Progress of a crack CB having extended across mask MB1 and reached mask MB2, was blocked approximately above the center of the width of mask MB2 (broken lines BLb in FIG. 2). Similarly, progress of a crack CC was blocked approximately above the center of the width of mask MB3 (broken line BLc in FIG. 2). As such, progress of the cracks approaching region A from the outside in FIG. 2 is blocked by the mask B group (MBG), and as a result, the rate of defective nitride semiconductor laser devices can be reduced if the ridge stripe portion is formed within region A in every laser device.

This is presumably because while the mask A width cannot be narrowed freely from the standpoint of a long lasing lifetime, narrowing the mask B width (MBW) than the mask A width (MAW) causes the following effects. Firstly, it is considered that inclination of the crystallographic axis in the nitride semiconductor layer can be made smaller above mask B than above mask A by narrowing the mask B width than the mask A width. Secondly, it is considered that the narrowed mask width causes reduction in size of a void liable to occur above the mask.

On the other hand, if the crystallographic axis orientation of the nitride semiconductor layer above the mask is degraded or a large void occurs above the mask, then the mask may become a new source of occurrence of a crack.

According to a result of the inventors' study, the above-described crack suppressing effect is most effective when the mask B width is more than 2 μm and less than 10 μm. The crack suppressing effect is halved unless the mask B width is set narrower than the mask A width.

Figure 8B:
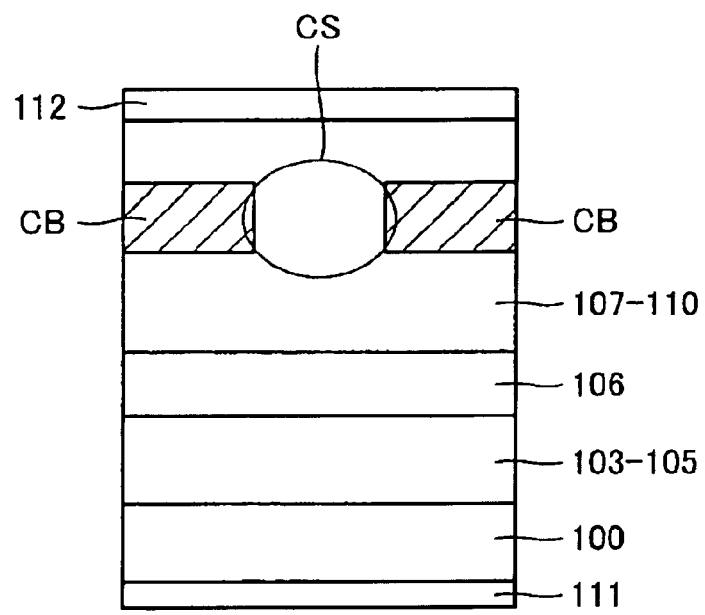
FIG. 8B is a schematic cross sectional view illustrating a nitride semiconductor laser device chip including a current-blocking layer.

Although the effect of varied mask widths has been explained taking the nitride semiconductor laser device chip having a ridge stripe structure (see FIG. 8A) as an example, the effect of varied mask widths is similarly obtained also in a nitride semiconductor laser device chip having a current-blocking layer (see FIG. 8B). In the case of the nitride semiconductor laser device chip having the current-blocking layer, the above-described ridge stripe portion (RS) corresponds to a portion (CS) sandwiched between two current-blocking layers (see FIGS. 8A and 8B). More generally, the ridge stripe portion and the portion sandwiched between the two current-blocking layers each correspond to a current-constricting portion through which substantial electric current is introduced via a p type layer or an n type layer into a light emitting layer and which contributes to emission of light.

It is needless to say that the mask groups on the nitride semiconductor substrate are not limited to two kinds of mask groups, mask A group and mask B group, but more than two kinds of mask groups may be provided as desired.

(Varied Window Widths)

The effect of varying the window widths is described with reference to the schematic cross sections in FIGS. 3 and 4. In the nitride semiconductor laser device chip shown in FIG. 3, an n electrode 111 and a p electrode 112 are formed on the same side with respect to a nitride semiconductor substrate 101. A mask A group (MAG) and mask B groups (MBG) are formed on nitride semiconductor substrate 101, and an underlayer 102 of nitride semiconductor film, n type layers 103–105, a light emitting layer 106, and p type layers 107–110 are successively crystal-grown to cover the mask groups. The mask A group (MAG) is arranged approximately beneath a ridge stripe portion (RS), and the mask B groups (MBG) are arranged on respective sides of the mask A group.

Figure 3:
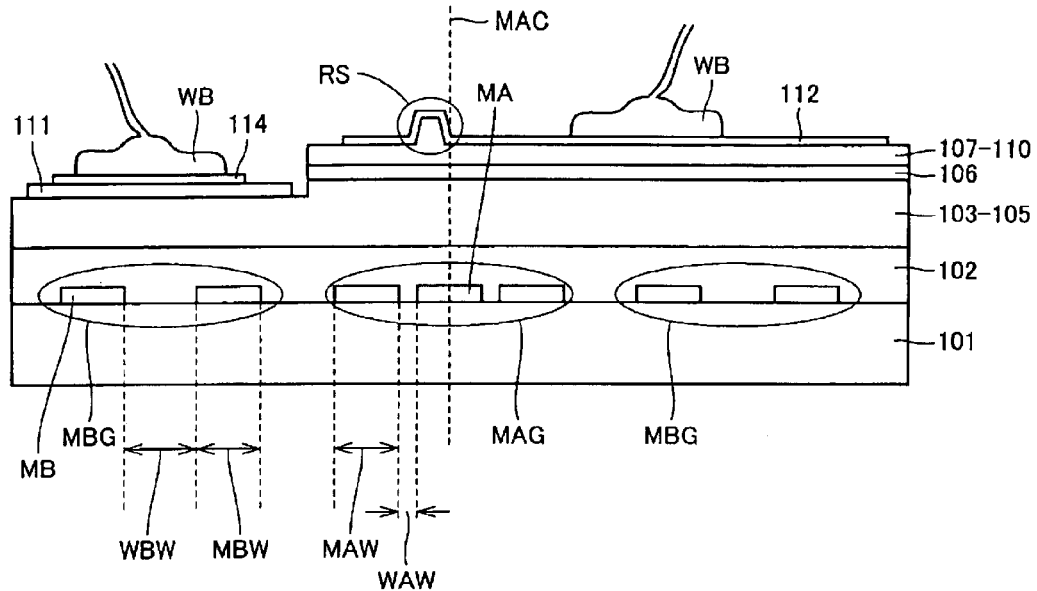
FIG. 3 is a schematic cross sectional view illustrating another example of the nitride semiconductor laser device chip according to the present invention.

In FIG. 3, the mask A width (MAW) and the mask B width (MBW) have been set equal to each other in the range of 10–20 µm, to study the effect of varied window widths. The window B width has been set wider than the window A width. The nitride semiconductor laser device chip shown in FIG. 3 may be made in a similar manner as will be described later in the second embodiment.

According to a result of the inventors' study, the lasing lifetime tends to extend as the window A width (WAW) in the mask A group (AG) beneath the ridge stripe portion (RS) becomes narrower. This is presumably because the crystal-grown nitride semiconductor layer exhibits a smaller effect of alleviating crystal strain in a region above the window width than in another region above the mask. That is, narrowing the window width leads to an increased mask occupying rate per unit area, which in turn increases the nitride semiconductor layer region alleviated in crystal strain. More detailed investigation from the standpoint of an extended lasing lifetime has revealed that the window A width is preferably greater than 2 µm and less than 10 µm, and more preferably greater than 2 µm and less than 6 µm. When the window A width became less than 10 µm, the lasing lifetime began to extend, and the elongation of the lasing lifetime was remarkable when the window A width became less than 6 µm (e.g., the lasing lifetime was more than about 15000 hours with a laser output of 30 mW at an ambient temperature of 60° C.). On the other hand, when the window A width becomes less than 2 µm, it begins to be difficult to completely cover the masks flatly, even if the nitride semiconductor underlayer covering the masks is grown thick.

In view of the result of the study regarding the window A width as described above, only the mask A group having a window A width set in the range of 2–10 µm was formed on the nitride semiconductor substrate, and a nitride semiconductor laser device was produced utilizing the same. The nitride semiconductor laser device thus produced, however, exhibited a high threshold current density.

Then, in the present invention, mask B groups (MBG) are arranged on respective sides of the mask A group (MAG) which is approximately beneath the ridge stripe portion (RS). Here, the mask B group on the either side of the mask A group is provided within the same nitride semiconductor laser device chip (see FIG. 3), and the window B width is set wider than the window A width as described above.

By doing so, it has been found that the threshold current density of the laser device can be decreased while realizing a long lasing lifetime. According to a result of more detailed investigation of the inventors, the window B width (WBW) is preferably greater than 5 µm and less than 40 µm, and more preferably greater than 11 µm and less than 30 µm. However, it is necessary to maintain the relation that the window B width is wider than the window A width. The effect of reducing the threshold current density began to appear when the window B width became more than about 5 µm, and the effect of reducing the threshold current density by more than about 3% began to appear when the window B width became more than 11 µm. There is no upper limit of the window B width from the standpoint of the threshold current density; i.e., the wider window B width is more preferable. When the window B width is too wide, however, it becomes difficult to decrease the crystal strain of the nitride semiconductor laser device. Thus, the window B width is preferably less than 40 µm, and more preferably less than 30 µm, from the standpoint of alleviation of the crystal strain.

A nitride semiconductor laser device chip having an n electrode formed on a back side of the nitride semiconductor substrate and having a p electrode formed on a p type layer is now described with reference to FIG. 4. In this nitride semiconductor laser device, a mask A group (MAG) and mask B groups (MBG) are formed on a nitride semiconductor substrate 101, and an underlayer 102 of nitride semiconductor film, n type layers 103–105, a light emitting layer 106, and p type layers 107–110 are successively crystal-grown to cover the mask groups. A ridge stripe portion (RS) is formed above the mask A group AG), and the mask B groups (MBG) are arranged on respective sides of the mask A group.

Figure 4:
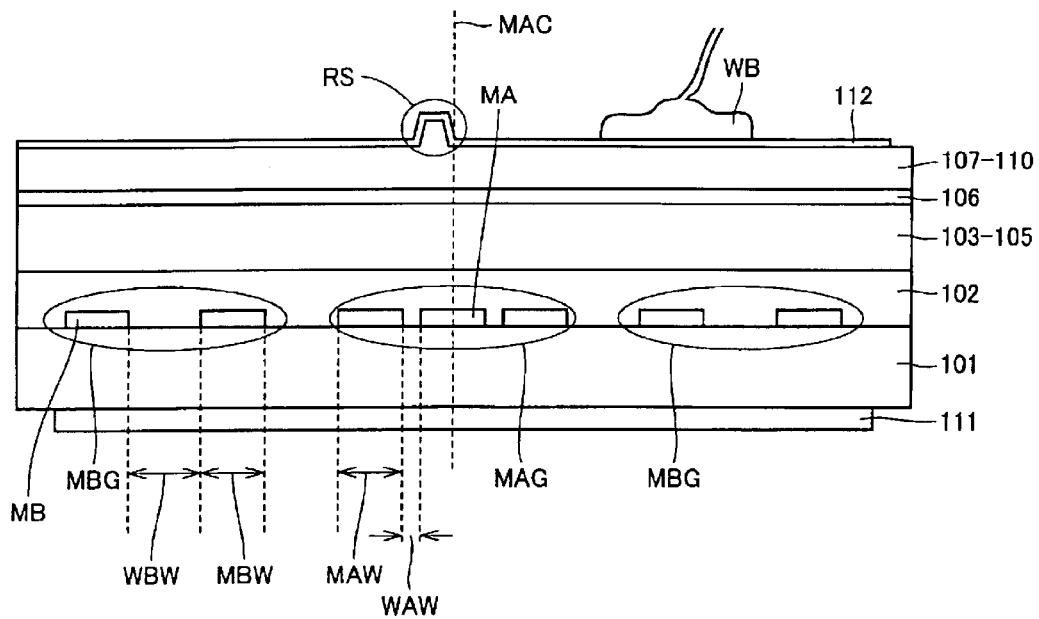
FIG. 4 is a schematic cross sectional view illustrating yet another example of the nitride semiconductor laser device chip according to the present invention.

In FIG. 4, the mask A width and the mask B width were set equal to each other within a range of 10–20 µm in order to study the effect of varied window widths. The window B width was set wider than the window A width. The nitride semiconductor laser device shown in FIG. 4 may be produced in a similar manner as will be described later in the second embodiment.

Similarly as described before, the window A width (WAW) of the mask A group located beneath the ridge stripe portion is preferably greater than 2 µm and less than 10 µm, and more preferably greater than 2 µm and less than 6 µm, from the standpoint of a long lasing lifetime.

According to a result of the inventors' study, it has been found that the lasing threshold voltage in the nitride semiconductor laser device is reduced by about 0.3 V to about 1 V when the mask B groups having the window B width (WBW) wider than the window A width are arranged on respective sides of the mask A group as shown in FIG. 4, compared to the case of including only the mask A group.

According to a result of detailed investigation of the inventors, the window B width (WBW) is preferably greater than 5 µm and less than 40 µm, and more preferably greater than 11 µm and less than 30 µm, similarly as described before. However, it is necessary to maintain the relation that the window B width is wider than the window A width. When the window B width is greater than about 5 µm, the effect of reducing the threshold voltage begins to appear, and the effect of reduction of more than about 0.5 V begins to be obtained when the window B width is greater than 11 µm. There is no upper limit of the window B width from the standpoint of the threshold voltage; i.e., the wider window B width is more preferable. When the window B width is too wide, however, the crystal strain of the nitride semiconductor laser device is less likely to be reduced. Thus, the window B width is preferably less than 40 µm, and more preferably less than 30 µm, from the standpoint of alleviation of the crystal strain.

Although the effect of varied window widths has been explained taking the nitride semiconductor laser device chip having a ridge stripe structure (see FIG. 8A) as an example, the effect of varied window widths is expected also in the nitride semiconductor laser device chip having a current-blocking layer (see FIG. 8B). Further, it is needless to say that, not limited to the two kinds of mask groups of mask A group and mask B group, more than two kinds of mask groups may be provided on the nitride semiconductor substrate as desired. It is also needless to say that the feature of varied window widths may be combined with the feature of varied mask widths described before.

(Longitudinal Direction of Stripe Mask)

The longitudinal direction of the stripe mask formed on the nitride semiconductor substrate having a main surface of a {0001} C. plane was most preferably in parallel with a <1-100> direction, and next preferably in parallel with a <11-20> direction. Even when the longitudinal direction of the mask made an angle of the order of within ±5° to such a specific crystal direction in the {0001} C. plane, it did not cause any substantial effect.

Figure 5A:
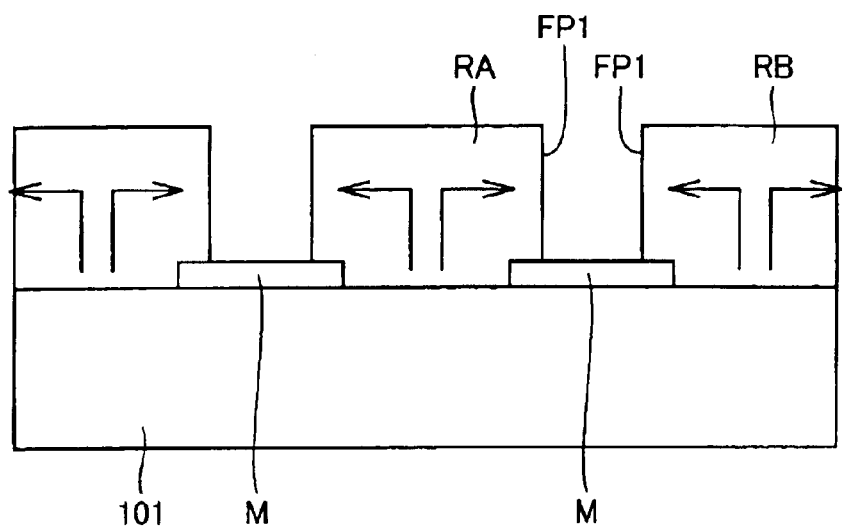
FIGS. 5A and 5B are schematic cross sectional views illustrating growth of a nitride semiconductor film on a mask substrate.

Forming the masks along the <1-100> direction of the nitride semiconductor substrate is advantageous in that the crack suppressing effect is remarkable. When the masks formed along this direction are covered with a nitride semiconductor film, the growing film forms primarily {11-20} facet planes on the masks and then covers them (see FIG. 5A). The {11-20} facet plane (FP1) is perpendicular to the main surface of substrate 101, and the mask (M) is formed of a growth inhibiting film suppressing epitaxial growth thereon. Thus, the nitride semiconductor regions (RA) and (RB) shown in FIG. 5A come into contact with each other only in their {11-20} facet planes (FP) thereby covering the masks. Accordingly, the crack which appeared in the nitride semiconductor region (RA) in FIG. 5A was hard to propagate into the nitride semiconductor region (RB). This feature of the <1-100> direction can be combined with the feature of the mask B group to cause a more enhanced crack suppressing effect.

On the other hand, formation of the masks along the <11-20> direction of the nitride semiconductor substrate is advantageous in that, when the masks are covered with a nitride semiconductor film, the surface morphology of the nitride film becomes favorable in the region above the masks. When the masks formed along this direction are covered with a nitride semiconductor film, the growing film forms primarily {1-101} facet planes (FP2) on the masks and then covers them. The {1-101} facet plane is extremely flat, and an edge portion (EP) where the facet plane comes into contact with a crystal growth plane is extremely sharp (see FIG. 5B). This is probably the reason why the morphology of the surface (FS) of the nitride semiconductor film covering the masks becomes favorable. If the surface morphology of the underlayer formed of nitride semiconductor film is good, it becomes possible to reduce the rate of defective nitride semiconductor laser device chips having their respective ridge stripe portions above the mask A groups.

(Nitride Semiconductor Underlayer)

The underlayer of nitride semiconductor film covering the mask substrate may contain at least one kind of impurity selected from among the impurity group of Si, O, Cl, S, C, Ge, Zn, Cd, Mg and Be. The following effects are obtained with respect to the underlayer of GaN film, AlGaN film or InGaN film.

The nitride semiconductor underlayer of GaN film is preferable in the following points. Firstly, since the GaN film is a binary mixed crystal, good controllability of crystal growth can be obtained. Further, the surface migration length of the GaN film is longer than that of the AlGaN film and shorter than that of the InGaN film, so that lateral crystal growth can be obtained appropriately to cover the masks completely and flatly. Here, the lateral growth refers to the growth in a direction parallel to the main surface of the substrate. Promotion of the lateral growth can alleviate the crystal strain in the nitride semiconductor film covering the masks. The GaN film used as the nitride semiconductor underlayer has an impurity concentration of preferably greater than $1 \times 10^{17}/cm^3$ and less than $5 \times 10^{18}/cm^3$. Addition of the impurity in this concentration range ensures good surface morphology of the nitride semiconductor underlayer and uniform thickness of the light emitting layer, thereby improving the characteristics of the light emitting device.

The nitride semiconductor underlayer of AlGaN film is preferable in the following points. When the AlGaN film covers the mask substrate, a void is less likely to be formed above the mask, so that the probability of occurrence of cracks is reduced. The AlGaN film containing Al has the surface migration length that is shorter than those of the GaN film and the InGaN film, and this means that the AlGaN film has good adhesiveness to the mask. This is probably the reason why the void is less likely to be formed above the mask.

According to a result of further investigation of the AlGaN film, the Al composition ratio x of the $Al_xGa_{1-x}N$ film is preferably greater than 0.01 and less than 0.15, and more preferably greater than 0.01 and less than 0.07. If the Al composition ratio x is smaller than 0.01, it is difficult to suppress occurrence of the void. If the Al composition ratio x is greater than 0.15, the surface migration length described above becomes too short (meaning insufficient lateral growth), in which case it may be hard to obtain the effect of alleviating the crystal strain above the mask. The effect similar to that of the AlGaN film can be obtained with any nitride semiconductor underlayer containing Al. Further, the AlGaN film used as the nitride semiconductor underlayer preferably has an impurity concentration of greater than $3 \times 10^{17}/cm^3$ and less than $5 \times 10^{18}/cm^3$. Addition of the impurity in this concentration range in addition to Al ensures a properly short surface migration length of the nitride semiconductor underlayer.

The nitride semiconductor underlayer of InGaN film is preferable in the following points. In the case that the mask substrate was covered with the InGaN film, considerable degradation of the lasing lifetime depending on a position of the formed ridge stripe portion did not occur. The InGaN film containing In is superior in elasticity to the GaN and AlGaN films. Thus, it is considered that the InGaN film covering the mask makes the crystal strain from the nitride semiconductor substrate distributed over the entire nitride semiconductor film, and thus alleviates difference between the crystal strain above the mask and the crystal strain above the window.

According to a result of further investigation of the InGaN film, the In composition ratio x of the $In_xGa_{1-x}N$ film is preferably greater than 0.01 and less than 0.18, and more preferably greater than 0.01 and less than 0.1. If the In composition ratio x is smaller than 0.01, the effect of superior elasticity because of inclusion of In may not be obtained. If the In composition ratio x is greater than 0.18, the crystallinity of the InGaN film may be degraded. The effect similar to that of the InGaN film can be obtained with any nitride semiconductor underlayer containing In. Further, the InGaN film used as the nitride semiconductor underlayer preferably has an impurity concentration of greater than $1 \times 10^{17}/cm^3$ and less than $4 \times 10^{18}/cm^3$. Addition of the impurity in this concentration range as well as In is advantageous in that the surface morphology of the nitride semiconductor underlayer becomes favorable and the elasticity can also be maintained.

(Thickness of Nitride Semiconductor Underlayer)

To completely cover the mask substrate with the underlayer of nitride semiconductor film, thickness of the covering film is preferably more than about 2 μm and less than 30 μm. Here, the covering film thickness refers to a thickness which corresponds to the film thickness obtained when a nitride semiconductor film is grown directly on a flat nitride semiconductor substrate. If the covering film thickness is thinner than 2 μm, it becomes difficult to cover the mask substrate completely and flatly with the nitride semiconductor film, though depending upon the mask width and the window width on the mask substrate. On the other hand, if the covering film thickness is thicker than 30 μm, the lasing lifetime becomes a little shorter. This is presumably because growth in the perpendicular direction (with respect to the main surface of the substrate) gradually becomes more prominent than lateral growth on the mask substrate, in which case it is difficult to fully obtain the effect of alleviating the crystal strain.

[Second Embodiment]

In a second embodiment, explanation is given for a method of forming a nitride semiconductor laser device chip having a ridge stripe structure formed on a filmed mask substrate. The matters not specifically explained in the present embodiment are the same as in the first embodiment described above.

(Method of Forming Filmed Mask Substrate)

Schematic cross sectional views of FIGS. 6A and 6B show a mask substrate 101m including masks formed on a GaN substrate 101 (FIG. 6A) and a filmed mask substrate 100 having an n type $Al_{0.05}Ga_{0.95}N$ film 102 covering the mask substrate (FIG. 6B), respectively. The mask substrate can be formed in the following manner.

Firstly, a growth inhibiting film of $SiO_2$ is formed to a thickness of 0.1 μm on a main surface of a (0001) plane of GaN substrate 101, by electron beam evaporation (EB method) or by sputtering. Thereafter, stripe masks are formed by lithography along the <1-100> direction of GaN substrate 101. The stripe masks include two kinds of masks, i.e., masks A (MA) and masks B (MB). The mask A group (MAG) is formed with a mask A width (MAW) of 13 μm and a window A width (WAW) of 7 μm. The mask B group (MBG) is formed with a mask B width (MBW) of 5 μm and a window B width (WBW) of 15 μm. Mask substrate 100m of the present embodiment is thus completed (FIG. 6A).

The mask substrate is subjected to organic cleaning thoroughly, and then transferred into a MOCVD (metallorganic chemical vapor deposition) system. $NH_3$ (ammonia) as a source material for the group V element and TMGa (trimethyl gallium) and TMAl (trimethyl aluminum) as source materials for the group III elements are supplied onto the mask substrate, $SiH_4$ (Si impurity concentration: $1 \times 10^{18}/cm^3$) as an impurity is added to the source materials, and a 6 μm-thick n type $Al_{0.05}Ga_{0.95}N$ film 102 is grown at a crystal growth temperature of 1050° C. The filmed mask substrate 100 of the present embodiment is thus completed (FIG. 6B).

The growth inhibiting film may be formed of $SiN_x$, $Al_2O_3$, or $TiO_2$, besides $SiO_2$. The longitudinal direction of the stripe masks may be along the <11-20> direction of GaN substrate 101, instead of the <1-100> direction. Further, although GaN substrate 101 having a main surface of the (0001) plane has been used as the nitride semiconductor substrate in the present embodiment, it is also possible to employ another nitride semiconductor substrate and another plane orientation. As to the orientation of the main surface of the substrate, a C plane {0001}, an A plane {11-20}, an R plane {1-102}, an M plane {1-100} or a {1-101} may be employed preferably. Good surface morphology is obtained with any substrate having the main surface with an off angle within 2 degrees from any of these plane orientations. As another nitride semiconductor substrate, an AlGaN substrate may be employed preferably for example, since it is preferable in the case of a nitride semiconductor laser that a layer having a refractive index lower than that of a clad layer is in contact with the outside of the clad layer to obtain a unimodal vertical transverse mode.

(Crystal Growth)

Figure 7:
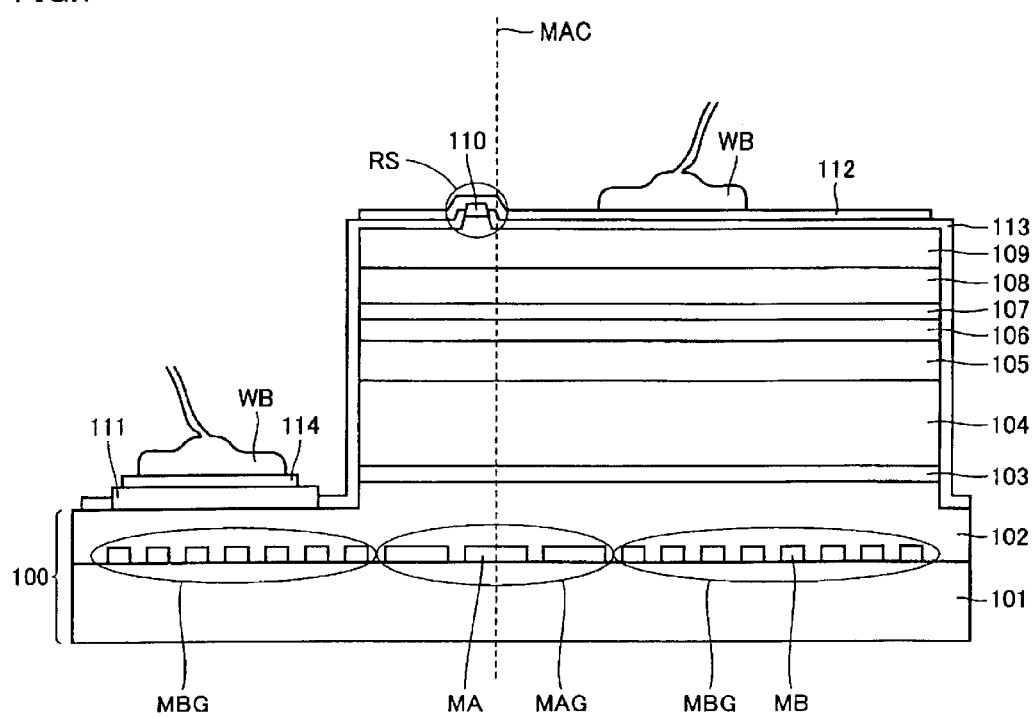
FIG. 7 is a schematic cross sectional view illustrating a further example of the nitride semiconductor laser device chip according to the present invention.

FIG. 7 shows a nitride semiconductor laser device chip grown on a filmed mask substrate. This nitride semiconductor laser device includes a filmed mask substrate 100 including masks A and B and an n type $Al_{0.05}Ga_{0.95}N$ underlayer 102 on a GaN substrate 101, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ clad layer 109, a p type GaN contact layer 110, an n electrode 111, a p electrode 112, a $SiO_2$ dielectric film 113, and an n type electrode pad 114. Wire bonding (WB) is carried out on p electrode 112 and on n type pad electrode 114.

In formation of this nitride semiconductor laser device, firstly in the MOCVD system, $NH_3$ as a source material for the group V element and TMGa or TEGa (triethyl gallium) as a source material for the group III element are added with TMIn (trimethyl indium) as a source material for the group III element and $SiH_4$ (silane) as an impurity on filmed mask substrate 100, to grow n type $In_{0.07}Ga_{0.93}N$ anti-crack layer 103 to a thickness of 40 nm at a crystal growth temperature of 800° C. Next, the substrate temperature is raised to 1050° C., and TMAl or TEAl (triethyl aluminum) as a source material for the group III element is used to grow n type $Al_{0.1}Ga_{0.9}N$ clad layer 104 (Si impurity concentration: $1 \times 10^{18}/cm^3$) to a thickness of 0.8 μm. N type GaN light guide layer 105 (Si impurity concentration: $1 \times 10^{18}/cm^3$) is then grown to a thickness of 0.1 μm.

Thereafter, the substrate temperature is lowered to 800° C., and light emitting layer (of multiple quantum well structure) 106 is formed including 8 nm thick $In_{0.01}Ga_{0.99}N$ barrier layers and 4 nm thick $In_{0.15}Ga_{0.85}N$ well layers stacked alternately with each other. In the present embodiment, light emitting layer 106 has the multiple quantum well structure starting and ending both with the barrier layers, including 3 quantum well layers (i.e., 3-cycles). The barrier and well layers are both doped with Si impurity at a concentration of $1 \times 10^{18}/cm^3$. A crystal growth break interval of at least one second and at most 180 seconds may be provided between growth of the barrier layer and growth of the well layer, or between growth of the well layer and growth of the barrier layer. Such intervals can improve flatness of the respective layers and also decrease the half-width of emission peak in the emission spectrum.

$AsH_3$ (arsine) or TBAs (tertiary butyl arsine) may be used to add As in light emitting layer 106. Similarly, $PH_3$ (phosphine) or TBP (tertiary butyl phosphine) may be used to add P, and TMSb (trimethyl antimony) or TESb (triethyl antimony) may be used to add Sb in light emitting layer 106. $NH_3$ as the source material of N may be replaced with dimethyl hydrazine in the formation of the light emitting layer.

Next, the substrate temperature is raised again to 1050° C. to successively grow 20 nm thick p type $Al0.2Ga_{0.8}N$ carrier block layer 107, 0.1 μm thick p type GaN light guide layer 108, 0.5 μm thick p type $Al_{0.1}Ga_{0.9}N$ clad layer 109, and 0.1 μm thick p type GaN contact layer 110. As the p type impurity, Mg ($EtCP_2Mg$: bisethylcyclopentadienyl magnesium) is added at a concentration from $5 \times 10^{19}/cm^3$ to $2 \times 10^{20}/cm^3$. The p type impurity concentration in p type GaN contact layer 110 is preferably increased as it approaches the interface with p electrode 112. This can reduce the contact resistance at the interface with the p electrode. Further, oxygen may be added by a minute amount during growth of the p type layers, to remove residual hydrogen in the p type layers that hinders activation of the p type impurity Mg.

After the growth of p type GaN contact layer 110, the entire gas in the reactor of the MOCVD system is replaced with nitrogen carrier gas and NH$_3$, and the substrate temperature is decreased at a cooling rate of 60° C./min. Supply of NH$_3$ is stopped when the substrate temperature is decreased to 800° C. The substrate is maintained at that temperature for five minutes, and then cooled to room temperature. The substrate is temporarily held at a temperature preferably in a range from 650° C. to 900° C., for a time period preferably in a range from 3 to 10 minutes. The cooling rate to the room temperature is preferably more than 30° C./min. The film thus crystal grown was evaluated by Raman spectroscopy, and it was found that the grown film already had the p type characteristic (i.e., Mg had already been activated), even without conventional annealing for giving the p type characteristic. The contact resistance was also reduced in formation of p electrode 112. When the conventional annealing for giving the p type characteristic was additionally applied, the activation ratio of Mg further improved favorably.

In$_{0.07}$Ga$_{0.93}$N anti-crack layer 103 of the present embodiment may have the In composition ratio of other than 0.07, or the layer itself may be omitted. However, the InGaN anti-crack layer is preferably inserted when crystal lattice mismatch is large between the clad layer and the GaN substrate.

Although light emitting layer 106 of the present embodiment has the structure starting and ending both with the barrier layers, it may have a structure starting and ending both with the well layers. The number of well layers within the light emitting layer is not restricted to 3 as described above. The threshold current density is sufficiently low with at most 10 well layers, enabling continuous lasing at room temperature. In particular, the well layers of at least 2 and at most 6 are preferable, ensuring the low threshold current density.

While Si has been added in both the well and barrier layers at a concentration of $1 \times 10^{18}$/cm$^3$ in light emitting layer 106 of the present embodiment, it may be added to none of the layers. However, the luminous intensity of the light emitting layer is increased when Si is added therein. At least one of O, C, Ge, Zn and Mg, besides Si, may be employed as the impurity to be added in the light emitting layer. The total impurity dose is preferably on the order of $1 \times 10^{17}$/cm$^3$ to $1 \times 10^{19}$/cm$^3$. Further, the impurity may be added only in either of the well and barrier layers, instead of both of the layers.

P type Al$_{0.2}$Ga$_{0.8}$N carrier block layer 107 of the present embodiment may have the Al composition ratio of other than 0.2, or the carrier block layer itself may be omitted. The threshold current density, however, was lowered with provision of the carrier block layer, because carrier block layer 107 has a function to confine the carriers in light emitting layer 106. The Al composition ratio of the carrier block layer is preferably set high to enhance the carrier confining effect. When the Al composition ratio is set low in the range guaranteeing the carrier confinement, mobility of the carriers increases in the carrier block layer, leading to favorable reduction of electric resistance.

Although Al$_{0.1}$Ga$_{0.9}$N crystals have been employed for p type clad layer 109 and n type clad layer 104 in the present embodiment, the Al composition ratio may be other than 0.1. If the Al composition ratio is increased, differences in energy gap and in refractive index compared with light emitting layer 106 increase, so that carriers and light can be confined in the light emitting layer efficiently, thereby enabling reduction of the lasing threshold current density. On the other hand, if the Al composition ratio is lowered in the range ensuring confinement of carriers and light, mobility of the carriers in the clad layers increases, so that an operating voltage of the device can be reduced.

The AlGaN clad layer preferably has a thickness of 0.7–1.5 μm. This ensures a unimodal vertical transverse mode and increases the light confining effect, and further enables improvement in optical characteristics of the laser and reduction of the lasing threshold current density.

The clad layer is not restricted to the ternary mixed crystal of AlGaN. It may be a quaternary mixed crystal of AlInGaN, AlGaNP, AlGaNAs or the like. Further, the p type clad layer may have a super-lattice structure formed of p type AlGaN layers and p type GaN layers or a super-lattice structure formed of p type AlGaN layers and p type InGaN layers for the purpose of reducing its electric resistance.

Although the crystal growth using the MOCVD system has been explained in the present embodiment, molecular beam epitaxy (MBE), hydride vapor phase epitaxy (HVPE) or the like may also be used for the crystal growth.

(Processing into Chips)

The epi-wafer formed in the above-described crystal growth (i.e., wafer having multiple layers of nitride semiconductor layers epitaxially grown on the filmed mask substrate) is taken out of the MOCVD system and processed into laser device chips. Here, the surface of the epi-wafer including the nitride semiconductor laser device layer is flat, and the masks and windows included in the mask substrate are completely covered with the nitride semiconductor underlayer and the light emitting device structure layer.

N type Al$_{0.05}$Ga$_{0.95}$N film 102 is partly exposed from the front side of the epi-wafer by dry etching, and then Hf and Al are deposited in this order to form n electrode 111 on the exposed part. N electrode pad 114 of Au is formed on n electrode 111 by evaporation. Ti/Al, Ti/Mo, Hf/Au or the like may also be used as the materials for the n electrode. Hf is preferably used for the n electrode to decrease the contact resistance of the n electrode. The n electrode may be formed on the back side of the mask substrate, since the mask substrate is formed of a nitride semiconductor. In this case, the nitride semiconductor substrate should be doped with an impurity such that it has an n type conductivity.

The p electrode portion is etched in a stripe manner along a longitudinal direction of the mask, to form a ridge stripe portion (RS in FIG. 7). The ridge stripe portion (RS) having a width of 1.7 μm is formed above mask A (MA), being 2 μm away in the mask width direction from the center (MAC in FIG. 7) of the mask A width (MAW). Thereafter, SiO$_2$ dielectric film 113 is formed by evaporation, and an upper surface of p type GaN contact layer 110 is exposed from the dielectric film. On the exposed surface of the contact layer, p electrode 112 as stacked layers of Pd/Mo/Au is formed by evaporation. Stacked layers of Pd/Pt/Au, Pd/Au, Ni/Au or the like may also be used for the p electrode.

Lastly, the epi-wafer is cloven in a direction perpendicular to the longitudinal direction of the ridge stripe, to form Fabri-Perot resonators of 500 μm each in length. In general, the resonator length is preferably in a range from 300 μm to 1000 μm. The resonators are formed along the <1-100> direction of the longitudinal direction of the stripe mask. The mirror end surfaces of the resonators correspond to the M plane {1-100} of the nitride semiconductor crystal. Cleavage for formation of the mirror end surfaces and chip division into laser devices are carried out with a scriber from the back side of filmed mask substrate 100. The cleavage is done with the scriber, by scratching not across the entire back surface of the wafer but only at portions of the wafer, e.g., only the both ends of the wafer. This prevents degradation of sharpness of the end surfaces and also prevents shavings due to the scribing from attaching to the epi-surface, thereby improving the yield of the devices.

As the feedback method of the laser resonator, commonly known DFB (distributed feedback), DBR (distributed bragg reflector) or the like may also be employed.

After formation of the mirror end surfaces of the Fabri-Perot resonator, dielectric films of $SiO_2$ and $TiO_2$ are alternately formed on one of the mirror end surfaces by evaporation, to make a dielectric multilayer reflection film having a reflectance of 70%. Alternatively, multilayer films of $SiO_2/Al_2O_3$ or the like may also be used for the dielectric multilayer reflection film.

According to cross sectional observation of the nitride semiconductor laser device chip practically formed in the above-described manner, it was found that masks A (MA) and masks B (MB) were formed in the same laser device chip as shown in FIG. 7. Formation of the nitride semiconductor laser device on the filmed mask substrate according to the present invention brought about alleviation of crystal strain and improvement of lasing lifetime. The probability of occurrence of cracks was also reduced, and the yield of the devices was improved. The threshold current density was also decreased by about 3%.

Although the nitride semiconductor laser device having the ridge stripe structure has been explained in the second embodiment, similar effects can be obtained with a nitride semiconductor laser device having a current-blocking layer (see FIG. 8B). Further, the mask A width, the window A width, the mask B width and the window B width on the mask substrate described in the present embodiment may be set to other numerical values each within the range satisfying the conditions described above in the first embodiment. The same applies to any of the following embodiments.

[Third Embodiment]

A third embodiment is similar to the first and second embodiments, except that a nitride semiconductor base substrate is employed and that a mask is formed on a nitride semiconductor layer stacked on the nitride semiconductor base substrate. In a method of forming the filmed mask substrate in the present embodiment, a GaN base substrate having a main surface of a (0001) plane is firstly placed in a MOCVD system. $NH_3$ and TMGa are supplied on the GaN base substrate, and a low-temperature GaN buffer layer is formed at a relatively low growth temperature of 550° C. The growth temperature is raised to 1050° C., and $NH_3$, TMGa and $SiH_4$ are supplied on the low-temperature GaN buffer layer to form an n type GaN layer. The nitride semiconductor substrate having the n type GaN layer formed thereon is then taken out of the MOCVD system.

Thereafter, a growth inhibiting film of $SiN_x$ of 0.15 μm thickness is deposited by sputtering to over the surface of the n type GaN layer on the substrate taken out of the MOCVD system. Thereafter, stripe masks A and B of $SiN_x$ are formed along the <1-100> direction of the GaN substrate by lithography. The mask A width is 10 μm, and the window A width is 2 μm. The mask B width is 3 μm, and the window B width is 15 μm. The mask substrate of the present embodiment is thus formed.

The mask substrate is subjected to organic cleaning thoroughly, and then transferred again into the MOCVD system. $NH_3$ as a source material for the group V element, TMG as a source material for the group III element, and $SiN_4$ (Si impurity concentration: $1\times10^{18}/cm^3$) as an impurity are supplied on the mask substrate, and a 5 μm thick GaN underlayer is deposited at a growth temperature of 1050° C. The filmed mask substrate of the present embodiment is thus formed.

The low-temperature GaN buffer layer explained in the present embodiment may be a low-temperature $Al_xGa_{1-x}N$ buffer layer ($0 \leq x \leq 1$), or the layer itself may be omitted. With a GaN substrate commercially available at the present, however, it is preferable to insert the low-temperature $Al_xGa_{1-x}N$ buffer layer to improve the unfavorable surface morphology of the GaN substrate. Here, the low-temperature buffer layer refers to a buffer layer formed at a relatively low growth temperature of about 450–600° C. The low-temperature buffer layer formed at a growth temperature in this range becomes polycrystalline or amorphous.

[Fourth Embodiment]

A fourth embodiment is similar to the first through third embodiments, except that masks of a mask substrate are formed not in stripes arranged in a single direction, but in a mask pattern including stripe masks arranged in different directions. That is, in the present embodiment, mask substrates having various mask patterns are explained with reference to the schematic top plan views of FIGS. 9A–9C.

Figure 9A:
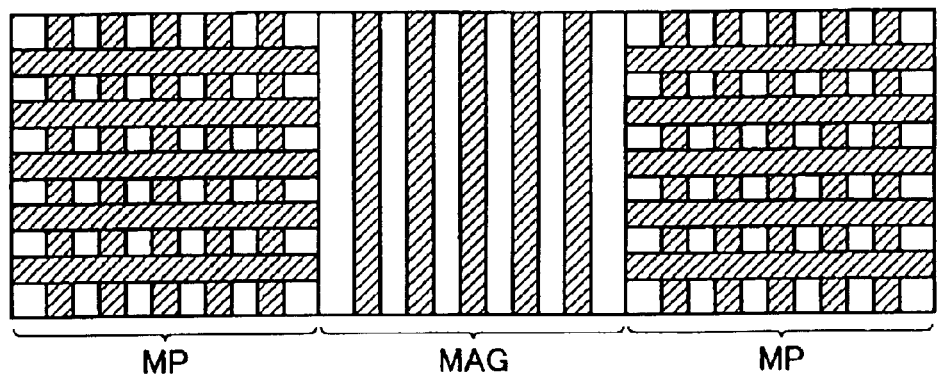

The mask substrate of FIG. 9A includes a mask pattern (MP) having stripe masks arranged in two directions perpendicular to each other. This mask pattern is provided at each side of such a mask A group (MAG) as described in the first embodiment and others. Use of such a mask substrate can improve the crack suppressing effect, and also improve the yield of the light emitting device chips.

Figure 9B:
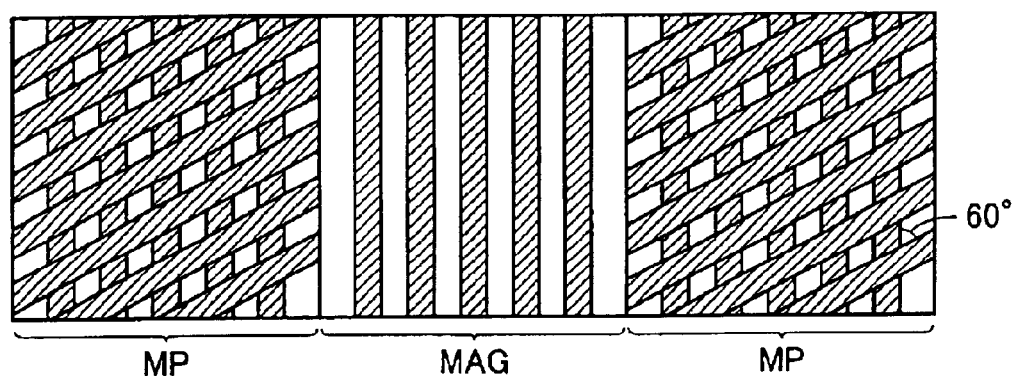

The mask substrate of FIG. 9B includes a mask pattern having stripe masks arranged in two directions at an angle of 60° with each other. This mask pattern is provided at each side of such a mask A group as described in the first embodiment and others. These two different directions are preferable particularly in the case of using a nitride semiconductor substrate having a main surface of a {0001} plane, since they exhibit characteristics equivalent in crystallography (e.g., equivalent in the manner of lateral growth). Use of the mask substrate as in FIG. 9B can also improve the crack suppressing effect as well as the yield of the light emitting device chips.

Figure 9C:
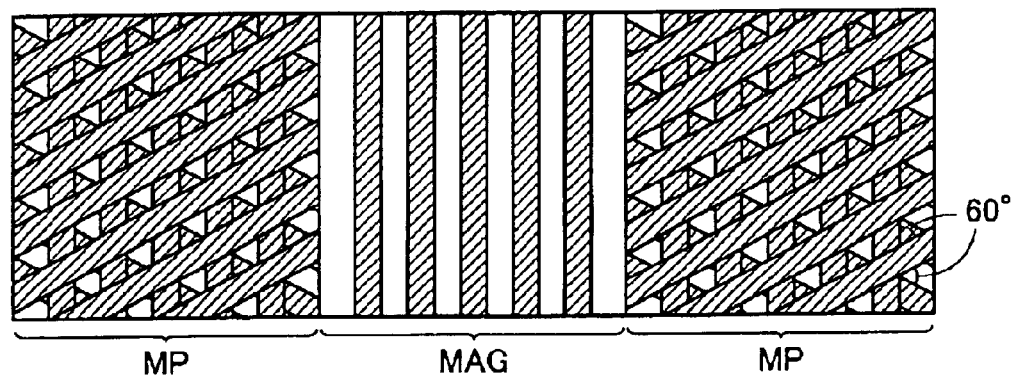

The mask substrate of FIG. 9C includes a mask pattern having stripe masks arranged in three directions at an angle of 60° with each other. This mask pattern is provided at each side of such a mask A group as described in the first embodiment and others. These three different directions are also preferable particularly in the case of using the nitride semiconductor substrate having a main surface of a {0001} plane, since they exhibit characteristics equivalent in crystallography. Use of the mask substrate as in FIG. 9C can also improve the crack suppressing effect and the yield of the light emitting device chips.

[Fifth Embodiment]

In a fifth embodiment, a nitride semiconductor light emitting diode device layer is formed on a filmed mask substrate. The light emitting diode device layer is similarly formed as in a conventional manner, except that a current-constricting portion of its light emitting layer is formed to be included in a region above a mask A group with mask B groups being arranged on respective sides of the mask A group. Electric current is introduced through the current-constricting portion which practically contributes to light emission.

When the present invention is applied to the nitride semiconductor light emitting diode device, the luminous intensity is improved. In particular, when a light emitting diode device having a short emission wavelength (less than 420 nm) or long emission wavelength (more than 600 nm), such as a nitride semiconductor diode device of white or amber color made using nitride semiconductor materials, is formed on the filmed mask substrate of the present invention, the luminous intensity is increased by more than about 1.5 times compared to the conventional one. Further, with a conventional nitride semiconductor light emitting diode device chip, cracks are liable to occur in a current-constricting portion of the light emitting layer through which a current is introduced and which practically contributes to light emission. The cracks are observed as non-light-emitting lines, causing degradation of luminous intensity and a defective device. According to the present invention, the luminous intensity of the nitride light emitting diode is improved, occurrence of cracks is suppressed, and the rate of defective devices is reduced.

[Sixth Embodiment]

A sixth embodiment is similar to the first, second and fifth embodiments, except that at least one substitutional element of As, P and Sb is included to substitute for some of N atoms in the light emitting layer. More specifically, at least one substitutional element of As, P and Sb is contained in substitution for some of N atoms in the well layer or the barrier layer within the light emitting layer of the nitride semiconductor light emitting device. Here, when the total composition ratio of As, P and/or Sb contained in the well layer is expressed as x and the composition ratio of N is expressed as y, x is smaller than y and $x/(x+y)$ is less than 0.3 (30%) and preferably less than 0.2 (20%). The lower limit of the total concentration of As, P and/or Sb is preferably greater than $1 \times 10^{18}/cm^3$.

This is because, when the composition ratio x of the substitutional element is greater than 20%, concentration separation begins to gradually occur in which the composition ratios of the substitutional element differ in regions within the well layer, and when the composition ratio x is greater than 30%, the concentration separation proceeds to crystal system separation into a hexagonal system and a cubic system, causing an increased possibility of degradation in crystallinity of the well layer. On the other hand, if the total concentration of the substitutional element is smaller than $1 \times 10^{18}/cm^3$, it is almost impossible to obtain the effect due to adding the substitutional element in the well layer.

The present embodiment has an effect that inclusion of at least one substitutional element of As, P and Sb in the well layer reduces the effective mass of electrons and holes in the well layer, thereby increasing mobility of the electrons and holes. In the case of a semiconductor laser device, the small effective mass means that carrier population inversion for lasing can be obtained by introducing a small amount of current. The increased mobility means that, even if electrons and holes in the light emitting layer are lost due to luminous recombination, electrons and holes can be newly introduced rapidly by diffusion. That is, according to the present embodiment, it is possible to obtain a semiconductor laser having a small threshold current density and exhibiting excellent self-sustained pulsation characteristics (excellent noise characteristics) compared to an InGaN-base nitride semiconductor laser device of which well layer does not contain any of As, P or Sb.

If cracks occur in the nitride semiconductor laser device chip, however, the As, P and Sb elements are liable to escape from the light emitting layer through the cracks and to diffuse into other layers, making it impossible to obtain the benefit due to including those elements within the light emitting layer.

In the present invention, the rate of occurrence of cracks can be decreased, while achieving a long lasing lifetime. Accordingly, it is possible to obtain the above-described benefit of inclusion of the As, P and Sb elements in at least the well layer within the light emitting layer of the nitride semiconductor light emitting laser device.

On the other hand, in the case that the present embodiment is applied to a nitride semiconductor light emitting diode device, inclusion of the substitutional elements of As, P and/or Sb in the well layer can reduce the In composition ratio within the well layer, compared to the case of the nitride semiconductor light emitting diode device including a conventional InGaN well layer. This means that degradation of crystallinity due to the In concentration separation can be suppressed. In particular, in the case of the nitride semiconductor light emitting diode device made using nitride semiconductor materials and having a short emission wavelength (less than 400 nm) or long emission wavelength (more than 600 nm), the well layer can be formed with a low composition ratio of In or even not containing In at all. As such, the device exhibits less color mottling and stronger luminous intensity than a conventional InGaN-base nitride semiconductor light emitting diode device. Such benefits of the nitride semiconductor light emitting diode device chip are achieved by virtue of the crack suppressing effect of the present invention, similarly as in the case of the above-described nitride semiconductor laser device chip.

[Seventh Embodiment]

In a seventh embodiment, a nitride semiconductor laser device in the above-described embodiments is applied to an optical apparatus. A nitride semiconductor laser device of violet color (with laser wavelength of 360–420 nm) in the above-described embodiments can preferably be employed in various optical apparatuses, e.g., in an optical pickup apparatus, from the following view point. Such a nitride semiconductor laser device operates stably at high temperature (60° C.) and at high output (30 mW), and has a long lasing lifetime, so that it is optimally applicable to a highly reliable high-density recording/reproducing optical disk apparatus (shorter laser wavelength enables recording/reproduction of higher density).

[Eighth Embodiment]

In a eighth embodiment, a nitride semiconductor light emitting diode device of the fifth or sixth embodiment is used for a semiconductor light emitting apparatus. Specifically, the nitride semiconductor light emitting diode device of the fifth or sixth embodiment is usable as at least one of light emitting diodes for optical three primary colors (red, green and blue) in a display apparatus (an example of the semiconductor light emitting apparatus). Use of such a nitride semiconductor light emitting diode device can realize a display apparatus suffering less color mottling and exhibiting strong luminous intensity.

Further, such nitride semiconductor light emitting diode devices capable of emitting optical three primary colors can also be used in a white light source apparatus. A nitride semiconductor light emitting diode device of the present invention having a emission wavelength in a range of ultraviolet to purple (about 360 nm to 440 nm) can also be used as a white light source apparatus by applying fluorescent coating.

Use of such a white light source makes it possible to realize a high-luminance backlight consuming less power, in place of a halogen light source conventionally used for a liquid crystal display. This white light source can be used as a backlight for a liquid crystal display in a man-machine interface of a portable notebook computer or a portable telephone, realizing a compact and high-definition liquid crystal display.

[Ninth Embodiment]

According to a ninth embodiment, in a nitride semiconductor laser chip using a mask substrate including a mask group formed on a partial region of one main surface of a nitride semiconductor substrate of a conductivity type and having counter electrodes arrangement, a current-constricting portion through which electric current is introduced into the light emitting layer and which substantially contributes to lasing is formed above the mask group, thereby realizing a long lasing lifetime and reduction of the threshold voltage. The effect of the present embodiment by forming the current-constricting portion above the mask group of the nitride semiconductor laser chip is obtained only in the case that the substrate included in the mask substrate of the laser chip is formed of such nitride semiconductor as in the case of the first embodiment.

(Mask Substrate)

Figure 13:
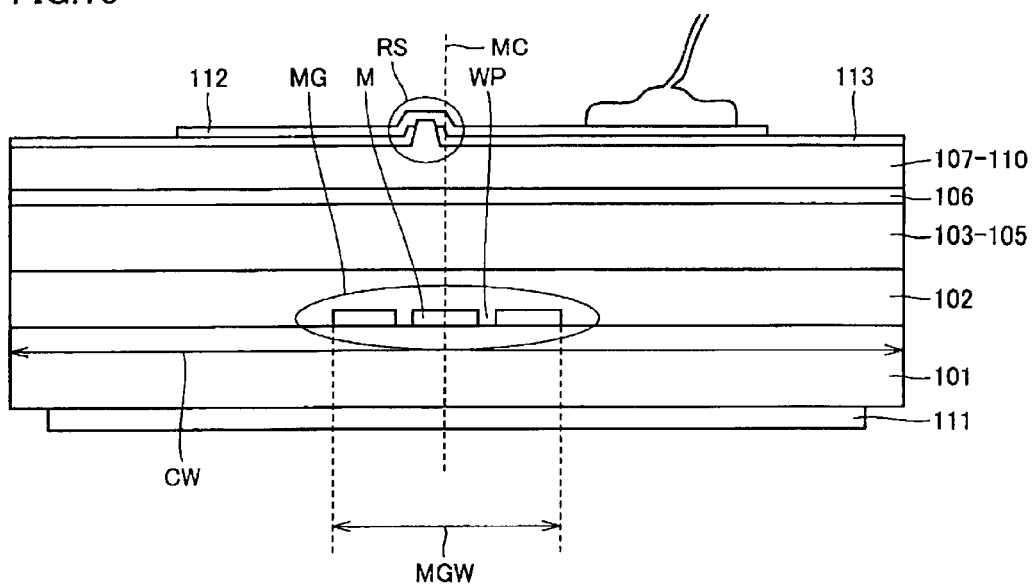
FIG. 13 is a schematic cross sectional view illustrating a nitride semiconductor laser chip formed on a mask substrate according to the present invention.

The nitride semiconductor laser chip according to the present embodiment shown in schematic cross section in FIG. 13 includes a mask substrate having a mask group (group of stripe masks formed of growth inhibiting film: MG) formed on an n type nitride semiconductor substrate 101, and an underlayer 102 of nitride semiconductor film, n type layers 103–105, a light emitting layer 106, and p type layers 107–110 are successively crystal-grown on the mask substrate. It also has a ridge stripe portion (RS). In this nitride semiconductor laser chip, an n electrode 111 is formed on the back side of n type nitride semiconductor substrate 101, and a p electrode 112 is formed on an upper side of a p type layer of the ridge stripe portion (RS) (i.e., it has the counter electrodes arrangement). The nitride semiconductor laser chip of FIG. 13 can be made in a similar manner as will be described later in the tenth embodiment.

The nitride semiconductor laser chip of the present embodiment is characterized in that it has the counter electrodes arrangement and in that the ridge stripe portion (RS) is formed above the mask group (MG) of the mask substrate, as shown in FIG. 13. Here, the width of the mask group (MG) from one side edge to another side edge is called a mask group width (MGW) (see FIG. 13). The width of the nitride semiconductor laser chip in a direction which is orthogonal to the longitudinal direction of the resonator (the direction perpendicular to the plane of the drawing of FIG. 13) is called a chip width (CW).

According to a result of the inventors' study, the lasing lifetime tends to be elongated in the case that the ridge stripe portion (RS) is formed above one mask (M) within the mask group (MG) included in the nitride semiconductor laser chip and that the center line (MC) of the mask width does not cross the ridge stripe portion. It has been found through further detailed investigation that the lasing lifetime begins to be elongated considerably in the case that the ridge stripe portion of the nitride semiconductor laser chip is formed above the mask and that a distance from the center of the mask to a side edge of the ridge stripe portion closer thereto is greater than about 1 $\mu$m. This is presumably because crystal strain of the nitride semiconductor layer region stacked above the mask is alleviated compared to that of the region stacked above the window. However, it is considered that, even above the mask, the crystal strain becomes large above the center of the mask.

It has been found that, from the standpoint of a long lasing lifetime, the mask width is preferably greater than 10 $\mu$m and less than 20 $\mu$m, and more preferably greater than 13 $\mu$m and less than 20 $\mu$m in the present embodiment, similarly as in the case of the mask width A of the first embodiment.

Further, the lasing lifetime tends to be elongated with a narrower width between the masks (i.e., a narrower width of the window (WP)) in the mask group (MG) in the present embodiment, similarly as in the case of the window width A of the first embodiment. From the standpoint of a long lasing lifetime, the window width is preferably greater than 2 $\mu$m and less than 10 $\mu$m, and more preferably greater than 2 $\mu$m and less than 6 $\mu$m.

In view of the result of the study about the mask width and window width as described above, a nitride semiconductor laser chip was formed using a mask substrate where masks each having a width of greater than 10 $\mu$m and less than 20 $\mu$m are arranged at intervals of the window width of greater than 2 $\mu$m and less than 10 $\mu$m over the entire surface of a nitride semiconductor substrate. The nitride semiconductor laser chip had the counter electrodes arrangement. With this nitride semiconductor laser chip, while the lasing lifetime was long, the threshold voltage was high. Thus, in the present embodiment, a nitride semiconductor laser chip was formed using a mask substrate where a mask group having the above-described mask width and window width was arranged only in the vicinity of a region beneath the ridge stripe portion. As a result, it was found that the lasing threshold voltage was decreased by about 0.2-0.9 V compared to the case of the nitride semiconductor laser chip using the mask substrate having the mask group arranged over the entire substrate. The decreased threshold voltage further caused elongation of the lasing lifetime by about some hundreds of hours compared to the conventional one.

Although the nitride semiconductor laser chip having the ridge stripe structure (see FIG. 8A) as in the case of the first embodiment has been described in the present embodiment, the present invention may of course be applicable to a nitride semiconductor laser chip having a current-blocking layer (see FIG. 8B).

(Relation Between Coverage Ratio of Mask Group and Threshold Voltage)

Figure 14:
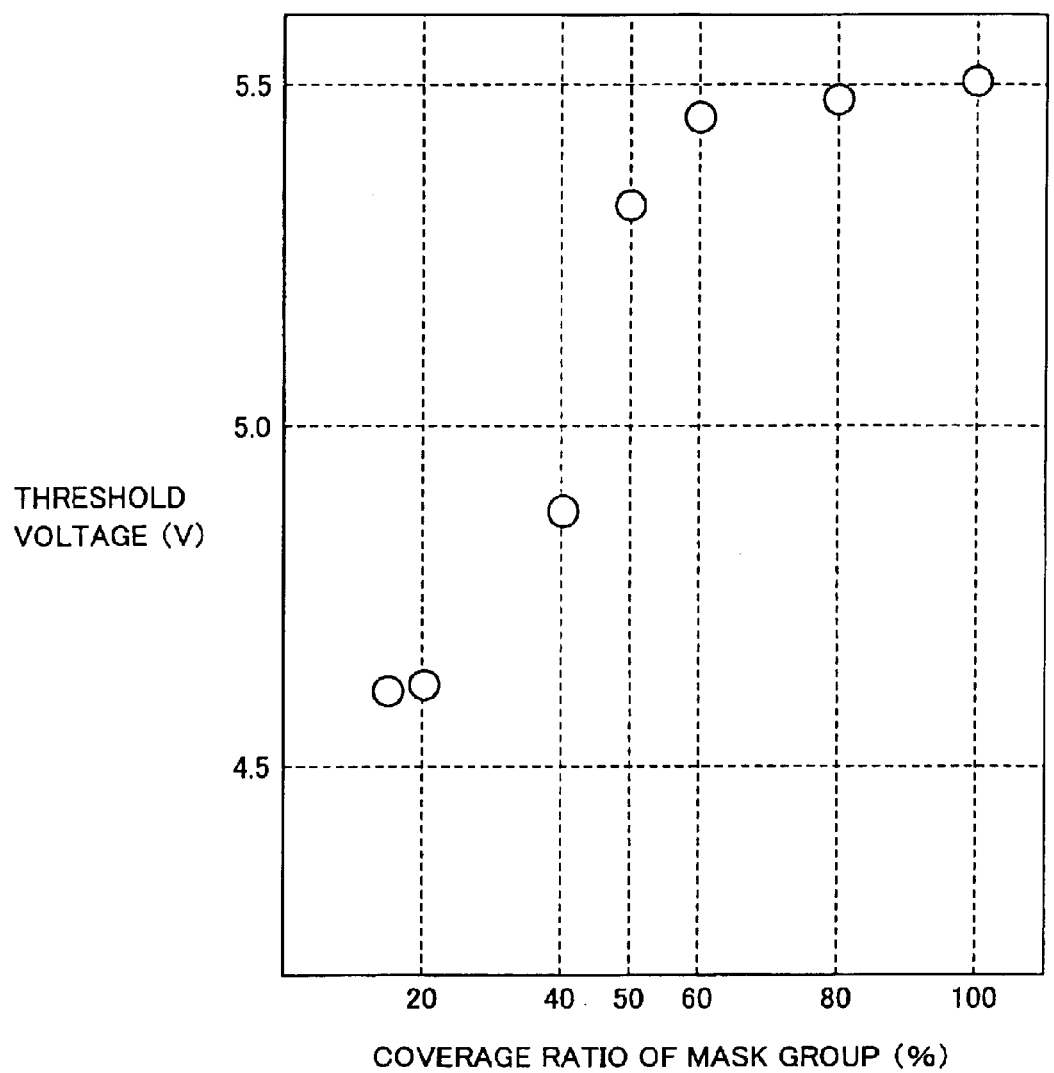
FIG. 14 is a graph illustrating the relation between the coverage ratio of the mask group and the threshold voltage in the present invention.

Firstly, the coverage ratio of the mask group here refers to a percentage of the mask group width with respect to the chip width shown in FIG. 13. In the graph of FIG. 14, the horizontal axis represents the coverage ratio (%) of the mask group, and the vertical axis represents the threshold voltage (V) of the nitride semiconductor laser chip which has the counter electrodes arrangement. As shown in FIG. 14, when the coverage ratio of the mask group decreases from about 50%, the threshold voltage begins to decrease (by about 0.2 V compared with the case of the coverage ratio of 100%). When the coverage ratio is less than about 40%, the threshold voltage decreases to lower than 5 V. When the coverage ratio is about 20%, the threshold voltage further decreases.

(Positional Relation Between Mask and Current-Constricting Portion)

As described above in connection with the mask substrate, the lasing lifetime tends to be elongated when the ridge stripe portion (RS) of the nitride semiconductor laser chip is formed above one mask (M) within the mask group (MG) and the center line (MC in FIG. 13) of the mask width does not cross the ridge stripe portion. Further, the lasing lifetime begins to be elongated considerably when the ridge stripe portion of the nitride semiconductor laser chip is formed above the mask and the distance from the mask center to the closer side edge of the ridge stripe portion is greater than about 1 μm.

Through further detailed investigation about the positional relation between the mask and the current-constricting portion, it has been found that the rate of defect in which the lasing lifetime of the nitride semiconductor laser chip becomes shorter than the guaranteed life decreases in the case that the current-constricting portion is formed in the above-described manner above a mask (M) located near the center of the mask group width (MGW). Further, the rate of defect in which the threshold voltage of the nitride semiconductor laser chip becomes greater than the guaranteed value decreases in the case that the current-constricting portion is formed in the above-described manner above a mask located near a side edge of the mask group.

(Longitudinal Direction of Stripe Mask)

In the ninth embodiment also, similarly as in the first embodiment, the longitudinal direction of the stripe mask formed on the nitride semiconductor substrate having a main surface of a {0001} C plane is most preferably in parallel with the <1-100> direction, and next preferably in parallel with the <11-20> direction. Even when the longitudinal direction of the mask made an angle of the order of within ±5° to such a specific crystal direction in the {0001} C plane, it did not cause any substantial effect.

Formation of the masks along the <1-100> direction of the nitride semiconductor substrate is advantageous in that it causes remarkable effects of suppressing crystal strain and occurrence of cracks. This effects can reduce the rates of defects (defect with the lasing lifetime shorter than the guaranteed life and defect due to occurrence of cracks) in the nitride semiconductor laser devices. When the masks formed along this direction are covered with a nitride semiconductor film, the film forms primarily the {11-20} facet planes on the masks to cover them (see FIG. 5A). The nitride semiconductor film grows from the {11-20} facet planes, presumably because the {11-20} facet plane (FP1) is perpendicular to the main surface of the nitride semiconductor substrate 101 and the mask (M) is formed of a growth inhibiting film suppressing epitaxial growth thereon. Here, the film grows in a direction parallel to the main surface of the substrate (lateral growth), thereby greatly enhancing the effects of suppressing crystal strain and occurrence of cracks. By incorporating the feature of the longitudinal <1-100> direction of the masks into the mask substrate, it becomes possible to reduce the rate of defective devices, since the effects of elongating the lasing lifetime and suppressing the cracks become more prominent.

Figure 5B:
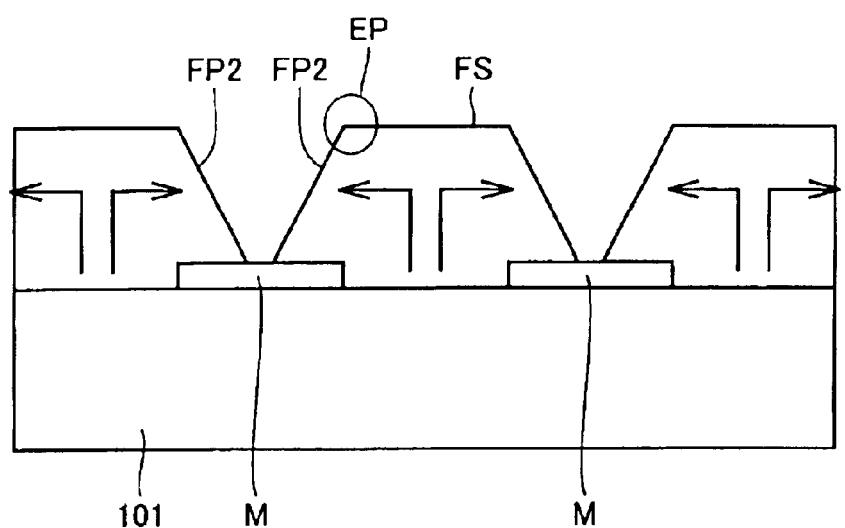

Formation of the masks along the <11-20> direction of the nitride semiconductor substrate is advantageous in that, when the masks are covered with the nitride semiconductor film, the surface morphology of the nitride film becomes favorable in a region above the masks. When a depression shown in FIG. 5B is observed from above the substrate, the nitride semiconductor film grows with the depression hardly meandering. The rates of defects (defect with the lasing lifetime shorter than the guaranteed lifetime and defect with the threshold voltage greater than the guaranteed value) in the nitride semiconductor laser devices each having the current-constricting portion formed above the mask substrate can be reduced when the surface morphology of the nitride semiconductor film is favorable and the nitride semiconductor film grows with the depression hardly meandering, presumably because of the following reasons. When the masks formed along the relevant direction are covered with the nitride semiconductor film, the nitride film forms primarily {1-101} facet planes (FP2) on the masks to cover them. The {1-101} facet plane is extremely flat, and the edge portion where the facet plane comes into contact with the crystal growth plane is also extremely sharp (see FIG. 5B). These facts are considered to be the reasons why the surface morphology of the nitride semiconductor film covering the masks becomes favorable.

The above-described masks (or windows) are in the form of stripes, which is preferable in the following point of view. That is, since the current-constricting portion of the nitride semiconductor laser device is generally in the stripe form, it is readily possible to make the current-constricting portion in an optimal position for a longer lasing lifetime when the masks are also in the form of stripes.

(Nitride Semiconductor Underlayer)

As the underlayer of the nitride semiconductor film for covering the mask substrate, GaN film, AlGaN film or InGaN film, for example, may be used in the ninth embodiment also, similarly as in the case of the first embodiment. It is also possible to add at least one impurity selected from the impurity group of Si, O, Cl, S, C, Ge, Zn, Cd, MG and Be in the nitride semiconductor underlayer.

Specifically, in the case of the nitride semiconductor underlayer of GaN film, controllability of crystal growth becomes favorable, since the GaN film is a binary mixed crystal. Further, the lateral growth of the underlayer is promoted, possibly alleviating the crystal strain within the nitride semiconductor film covering the masks. The GaN film used as the nitride semiconductor underlayer preferably has an impurity concentration of greater than $1 \times 10^{17}/cm^3$ and less than $8 \times 10^{18}/cm^3$. Addition of the impurity in such a concentration range results in favorable surface morphology of the nitride semiconductor underlayer and hence a uniformed thickness of the light emitting layer, so that the device characteristics can be improved.

In the case of the nitride semiconductor underlayer of AlGaN film, a void is less likely to be formed above the mask when the AlGaN film covers the mask substrate. The rate of occurrence of cracks is reduced and the lasing lifetime can be improved. Since the surface migration length of the AlGaN film is short, the nitride semiconductor film readily crystal-grow from the sidewall of the facet plane described in conjunction with FIGS. 5A and 5B. Thus, the lateral growth becomes more prominent, and the crystal strain is alleviated. As a result, the lasing lifetime can be improved. The Al composition ratio x in the $Al_xGa_{1-x}N$ film is preferably greater than 0.01 and less than 0.15, and more preferably greater than 0.01 and less than 0.07. The AlGaN film used as the nitride semiconductor underlayer preferably has an impurity concentration of greater than $3 \times 10^{17}/cm^3$ and less than $5 \times 10^{18}/cm^3$. Addition of the impurity in this concentration range as well as Al advantageously shortens the surface migration length of the nitride semiconductor underlayer, so that the crystal strain can further be alleviated.

In the case of the nitride semiconductor underlayer of InGaN film, difference in lasing lifetime depending on difference in position where the current-constricting portion is formed can be made small by covering the mask substrate with the InGaN film, and then the rate of defect (defect of the lasing lifetime shorter than the guaranteed lifetime) in the nitride semiconductor laser chips can be reduced. The In composition ratio x of the $In_xGa_{1-x}N$ film is preferably greater than 0.01 and less than 0.18, and more preferably greater than 0.01 and less than 0.1. The InGaN film used as the nitride semiconductor underlayer preferably has an impurity concentration of greater than $1 \times 10^{17}/cm^3$ and less than $5\times10^{18}/cm^3$. Addition of the impurity in this concentration range along with in results in favorable surface morphology of the nitride semiconductor underlayer, and elasticity of the underlayer can be maintained advantageously.

(Thickness of Nitride Semiconductor Underlayer)

The nitride semiconductor underlayer has a thickness of preferably greater than about 2 μm and less than about 30 μm to completely cover the mask substrate in the ninth embodiment, similarly as in the case of the first embodiment.

[Tenth Embodiment]

In a tenth embodiment, explanation is given for a method of forming a nitride semiconductor laser chip having a ridge stripe structure formed on a filmed mask substrate. The matters not specifically explained in the present embodiment are similar as in the preceding ninth embodiment.

(Method of Forming Filmed Mask Substrate)

In FIG. 11, a mask substrate 101m including a mask 200 formed on an n type GaN substrate 101 is shown both in top plan view and cross sectional view. Masks 200 each having a prescribed mask width (MW) are arranged at intervals of a window width (WW). In FIG. 11, the reference character WP represents the window, the characters MC and WC represent the mask center and the window center, respectively, and the arrow (MSD) represents the mask stripe direction.

A schematic cross sectional view of FIG. 12 shows a mask substrate having masks 200 formed on an n type GaN substrate 101, and a filmed mask substrate 100 having an n type $Al_{0.02}Ga_{0.98}N$ underlayer 102 covering the mask substrate. The mask substrate can be formed in the following manner.

Firstly, a growth inhibiting film of $SiO_2$ is formed to a thickness of 0.1 μm on a (0001) main surface of n type GaN substrate 101 by electron beam evaporation (EB method) or by sputtering. Thereafter, $SiO_2$ masks 200 are formed in stripes along the <1-100> direction of GaN substrate 101 by lithography. The stripe masks 200 are formed with a mask width (MW) of 13 μm and a window width (WW) of 7 μm so that three stripe masks can be included in one nitride semiconductor laser chip. In this case, the mask group width is 53 μm, the chip width is 300 μm, and the coverage ratio of the mask group is 17.7%. The mask substrate of the present embodiment is thus completed.

The mask substrate is subjected to organic cleaning thoroughly, and then transferred into a MOCVD system. $NH_3$ as a source material for the group V element and TMGa and TMAl as source materials for the group III elements are supplied on the mask substrate, $SiH_4$ (Si impurity concentration: $1\times10^{18}/cm^3$) as an impurity is further added to the source materials, and then a 25 μm-thick n type $Al_{0.02}Ga_{0.98}N$ underlayer 102 is grown at a crystal growth temperature of 1050° C. The filmed mask substrate 100 of the present embodiment is thus completed (FIG. 12).

The growth inhibiting film may be formed of $SiN_x$, $Al_2O_3$, or $TiO_2$, besides $SiO_2$ in the tenth embodiment also, similarly as in the second embodiment. The longitudinal direction of the stripe mask may be along the <11-20> direction of n type GaN substrate 101, instead of the <1-100> direction thereof. Further, although n type GaN substrate 101 having a (0001) main surface has been used as the nitride semiconductor substrate in the present embodiment, another main surface orientation and another nitride semiconductor substrate may also be employed. As to the main surface orientation of the substrate, a C plane {0001}, an A plane {11-20}, an R plane {1-102}, an M plane {1-100} or a {1-101} plane may be employed preferably. Good surface morphology can be obtained with any substrate having a main surface with an off-angle within 2 degrees from any of these plane orientations. In the case of a nitride semiconductor laser, an n type AlGaN substrate, for example, can be employed preferably as another nitride semiconductor substrate, since it is preferable that a layer having a refractive index lower than that of a clad layer is in contact with the outside of the clad layer to obtain a unimodal vertical transverse mode.

(Crystal Growth)

Figure 10:
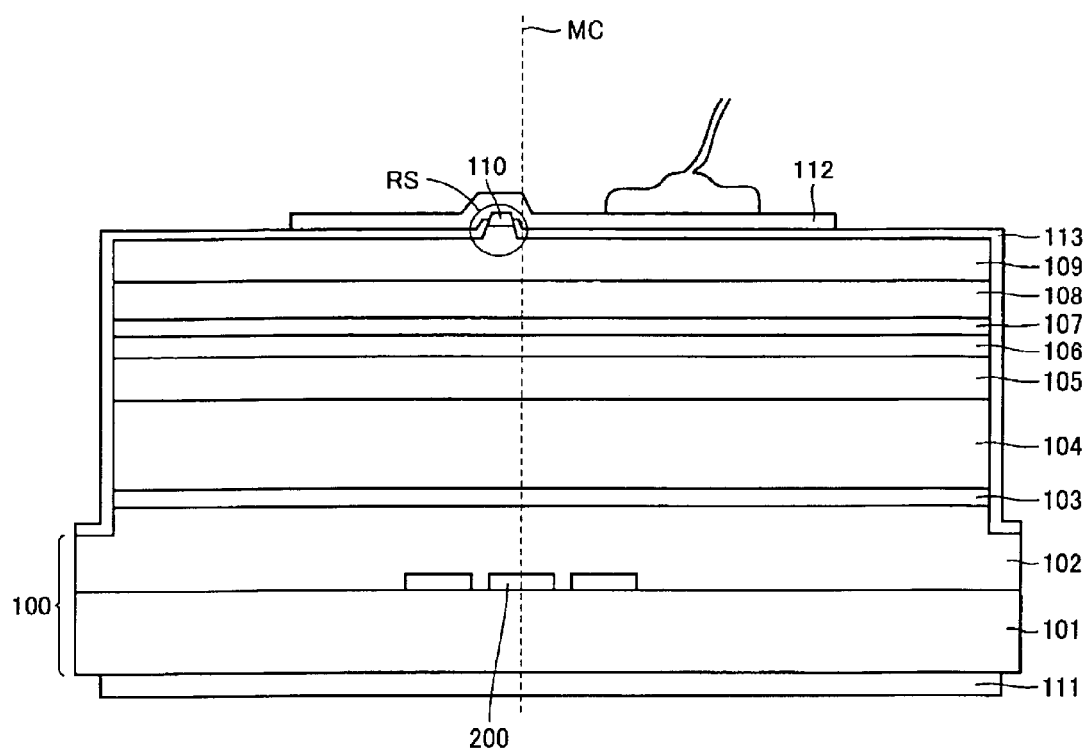
FIG. 10 is a schematic cross sectional view illustrating still another example of the nitride semiconductor laser device chip according to the present invention.

FIG. 10 shows a nitride semiconductor laser chip grown on filmed mask substrate 100. This nitride semiconductor laser chip includes a filmed mask substrate 100 including masks 200 and an n type $Al_{0.02}Ga_{0.98}N$ underlayer 102 on an n type GaN substrate 101, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113.

In formation of this nitride semiconductor laser device, firstly in the MOCVD system, $NH_3$ as a source material for the group V element and TMGa or TEGa as a source material for the group III element with TMIn as a source material for the group III element and $SiH_4$ as an impurity are supplied over filmed mask substrate 100, to grow n type $In_{0.07}Ga_{0.93}N$ anti-crack layer 103 to a thickness of 40 nm at a crystal growth temperature of 800° C. Next, the substrate temperature is raised to 1050° C., and TMAl or TEAl; as a source material for the group III element is used to grow n type $Al_{0.1}Ga_{0.9}N$ clad layer 104 (Si impurity concentration: $1\times10^{18}/cm^3$) to a thickness of 1.2 μm. N type GaN light guide layer 105 (Si impurity concentration: $1\times10^{18}/cm^3$) is then grown to a thickness of 0.1 μm.

Thereafter, the substrate temperature is lowered to 750° C., to form light emitting layer (of multiple quantum well structure) 106 including 8 nm thick $In_{0.01}Ga_{0.99}N$ barrier layers and 4 nm thick $In_{0.15}Ga_{0.85}N$ well layers stacked alternately with each other. In the present embodiment, light emitting layer 106 has the multiple quantum well structure starting and ending both with the barrier layers, including 3 quantum well layers (i.e., 3-cycles). The barrier and well layers are both doped with Si impurity at a concentration of $1\times10^{18}/cm^3$. A crystal growth break interval of at least one second and at most 180 seconds may be provided between growth of the barrier layer and growth of the well layer, or between growth of the well layer and growth of the barrier layer. This can improve flatness of the respective layers and also decrease the half-width of emission peak in the emission spectrum.

It is needless to say that As, P, and/or Sb may be added to light emitting layer 106 in the tenth embodiment also, similarly as in the second embodiment.

Formation of layers from p type $Al_{0.2}Ga_{0.8}N$ carrier block layer 107 to p type GaN contact layer 110 and cooling thereafter to room temperature in the tenth embodiment were carried out in a similar manner as in the second embodiment.

The InGaN anti-crack layer 103 of the present embodiment may be omitted, similarly as in the case of the second embodiment. Further, the effect of the number of well layers in light emitting layer 106 and the effect of the added impurity in the present embodiment are similar to those in the second embodiment.

Still further, p type $Al_{0.2}Ga_{0.8}N$ carrier block layer 107, p type clad layer 109 and n type clad layer 104 of the present embodiment bring about similar effects as in the second embodiment if they satisfy the requirements of the second embodiments.

Although the crystal growth using the MOCVD system has been described in the present embodiment, it is needless to say that an MBE method, an HVPE method and others may also be employed.

(Processing into Chips)

The epi-wafer formed in the above-described crystal growth (i.e., wafer having multiple layers of nitride semiconductor layers epitaxially grown on the filmed mask substrate) is taken out of the MOCVD system and processed into laser device chips. Here, the surface of the epi-wafer including the nitride semiconductor laser device layer is flat, and the masks and windows included in the mask substrate are completely covered with the nitride semiconductor underlayer and the light emitting device structure layer.

Hf and Al are deposited in this order to form n electrode 111. Ti/Al, Ti/Mo, Al/Hf/Au or the like may also be used as the materials for the n electrode. Hf is preferably used for the n electrode to decrease the contact resistance of the n electrode.

The p electrode portion is etched in a stripe manner along a longitudinal direction of mask 200, to form a ridge stripe portion (see FIG. 10). The ridge stripe portion (RS) is formed above the mask to have a width of 1.7 μm, at a position 2 μm away in the mask width direction from the center of the mask, avoiding a position just above the mask center (MC). Thereafter, $SiO_2$ dielectric film 113 is formed by evaporation, and an upper surface of p type GaN contact layer 110 is exposed from the dielectric film. On the exposed surface of the contact layer, p electrode 112 as stacked layers of Pd/Mo/Au is formed by evaporation. Stacked layers of Pd/Pt/Au, Pd/Au, Ni/Au or the like may also be used for the p electrode.

Lastly, the resonators are formed by cleavage and the reflective films are formed on the end surfaces thereof in a similar manner as in the second embodiment. The width of the nitride semiconductor laser chip after chip division was 300 μm.

(Packaging)

For a nitride semiconductor laser chip of high output (greater than 30 mW), attention should be paid to measures for heat dissipation. For example, a high output laser chip with being preferably junction-down is connected to a package body by an In soldering material. Alternatively, the high output laser chip may be connected via a sub-mount of Si, AlN, diamond, Mo, CuW, BN, Fe, Cu, Sic, or Au, instead of being directly attached to the package body or a heat sink portion.

Conclusively, use of the mask substrate according to the present embodiment brought about improvement of the lasing lifetime, and the lasing threshold voltage was 4.6 V.

As to the mask width, window width and coverage ratio of mask group of the mask substrate described in the tenth embodiment, other numerical values may be employed under the conditions described in the ninth embodiment. The same applies to the following embodiments.

[Eleventh Embodiment]

An eleventh embodiment is similar to the ninth and tenth embodiments, except that the nitride semiconductor laser chip having a ridge stripe structure as described in the tenth embodiment is changed to a nitride semiconductor laser chip having a current-blocking structure (FIG. 8B).

Figure 15:
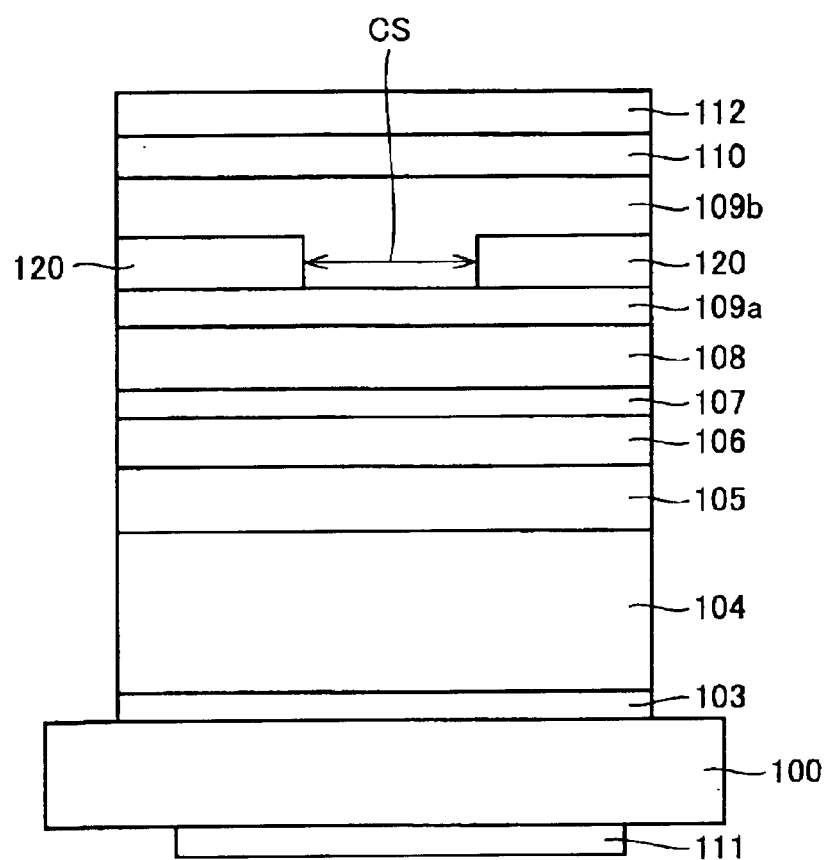
FIG. 15 is a schematic cross sectional view illustrating an embodiment of the nitride semiconductor laser device chip including a current-blocking layer.

The nitride semiconductor laser chip having a current-blocking layer of the present embodiment shown in FIG. 15 includes a filmed mask substrate 100, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ first clad layer 109a, a pair of current-blocking layers 120, a p type $Al_{0.1}Ga_{0.9}N$ second clad layer 109b, a p type GaN contact layer 110, an n electrode 111, and a p electrode 112.

Current-blocking layer 120 may be any layer that can block electric current introduced from p type electrode 112 to let it pass only through a width (CS) between the pair of current-blocking layers as shown in FIG. 15. For example, an n type $Al_{0.25}Ga_{0.75}N$ layer may be used as current-blocking layer 120, though the Al composition ratio thereof may be other than 0.25.

In the eleventh embodiment, similar effects as in the ninth and tenth embodiments can be obtained.

[Twelfth Embodiment]

A twelfth embodiment is similar to the ninth through eleventh embodiments, except that a nitride semiconductor base substrate having a polarity is employed and that a mask is formed on a nitride semiconductor layer stacked on the nitride semiconductor base substrate. In a method of forming the filmed mask substrate of the present embodiment, firstly, an n type GaN base substrate having a (0001) main surface is placed in a MOCVD system. $NH_3$ and TMGa are supplied on the GaN base substrate, to form a low-temperature GaN buffer layer at a relatively low growth temperature of 550° C. The growth temperature is raised to 1050° C., and $NH_3$, TMGa and $SiH_4$ are supplied on the low-temperature GaN buffer layer to form an n type GaN layer. The nitride semiconductor substrate having the n type GaN layer formed thereon is then taken out of the MOCVD system.

On a surface of the n type GaN layer of the substrate taken out of the MOCVD system, a growth inhibiting film of $SiN_x$ is deposited to a thickness of 0.15 μm by sputtering. Thereafter, stripe masks of $SiN_x$ are formed along the <1-100> direction of the n type GaN substrate by lithography, with a mask width of 8 μm and a window width of 2 μm. The masks were formed such that five stripe masks are included in one nitride semiconductor laser chip. In this case, the mask group width was 48 μm, the chip width was 250 μm, and the coverage ratio of mask group was 19.2%. The mask substrate of the present embodiment is thus formed.

The mask substrate is subjected to organic cleaning thoroughly, and then transferred again into the MOCVD system. $NH_3$ as a source material for the group V element, TMG as a source material for the group III element, and $SiN_4$ (Si impurity concentration: $1\times10^{18}/cm^3$) as an impurity are supplied on the mask substrate, and a 20 μm thick GaN underlayer is deposited at a growth temperature of 1050° C. The filmed mask substrate of the present embodiment is thus formed. Thereafter, a nitride semiconductor laser device layer is formed on the filmed mask substrate in a similar manner as in the tenth or eleventh embodiment.

The low-temperature GaN buffer layer explained in the present embodiment may be a low-temperature $Al_xGa_{1-x}N$ buffer layer ($0 \leq x \leq 1$), or the layer itself may be omitted, similarly as in the third embodiment.

The effects obtained in the twelfth embodiment are similar as in the ninth embodiment.

[Thirteenth Embodiment]

A thirteenth embodiment is similar to the ninth through twelfth embodiments, except that a substitutional element of at least one of As, P and Sb is included in the light emitting layer to substitute for some of N atoms. The preferable concentration range and the effects of the substitutional elements of As, P and Sb in the present embodiment are similar to those of the sixth embodiment. Specifically, in the present embodiment, it is possible to obtain a semiconductor laser low in threshold current density and excellent in self-sustained pulsation characteristics (noise characteristics) compared to an InGaN-base nitride semiconductor laser device of which light emitting layer does not contain any of As, P or Sb. Generally, the lasing lifetime tends to be elongated as the threshold current density decreases. Thus, in the present embodiment, a still longer lasing lifetime can be achieved. The laser chip of the present embodiment consumes less power and can optimally be used for a high output laser, since the threshold voltage is also decreased as the effect of the present invention.

[Fourteenth Embodiment]

In a fourteenth embodiment, a nitride semiconductor laser chip of the above-described embodiments is applied to an optical apparatus. A nitride semiconductor laser chip of violet color (laser wavelength of 360–420 nm) in the above embodiments can preferably be used in various optical apparatuses, e.g., in an optical pickup apparatus, for the following reasons. The relevant nitride semiconductor laser device operates stably (or reliably with a long lasing lifetime) at high temperature (60° C.) and at high output (30 mW), and has a low threshold voltage (consuming less power). Thus, it can optimally be used for a portable, high-density recording/reproducing optical disk apparatus (shorter laser wavelength enables recording/reproduction of higher density).

Figure 16:
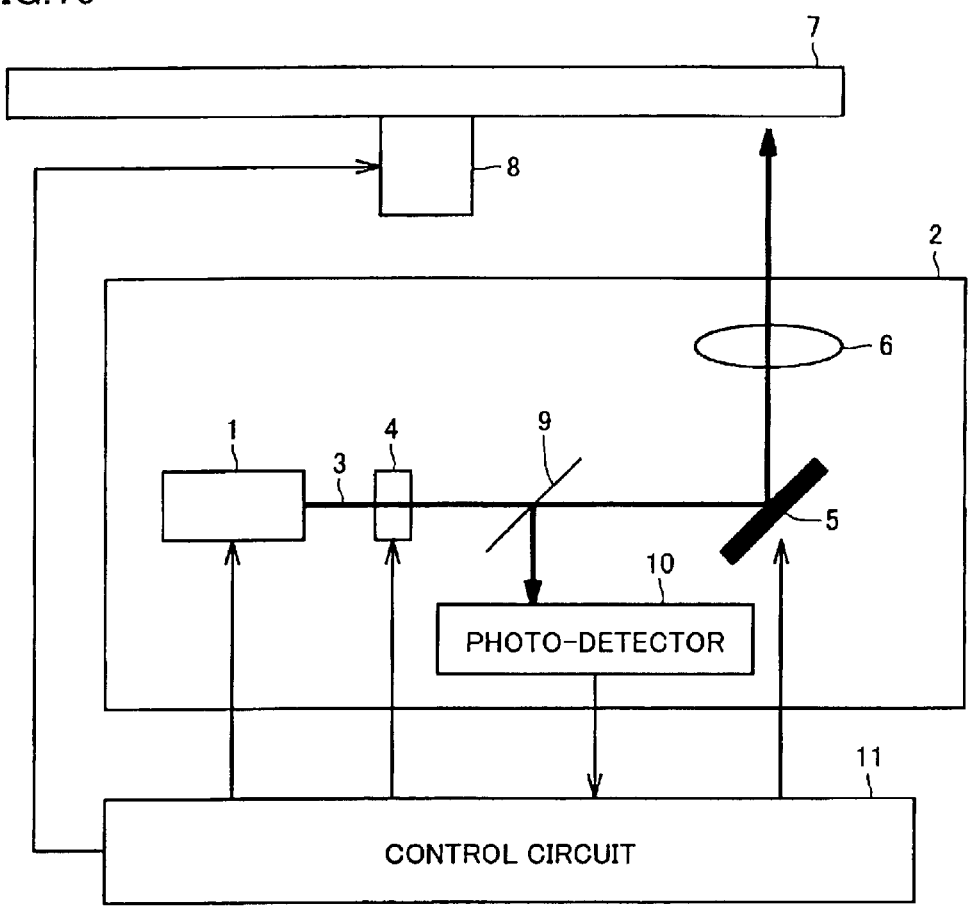
FIG. 16 is a schematic block diagram illustrating an example of an optical apparatus which includes an optical pickup apparatus utilizing the nitride semiconductor laser chip according to the present invention.

In FIG. 16, as an example of a nitride semiconductor laser device of the above embodiments being used for an optical apparatus, an optical disk apparatus including an optical pickup such as a DVD apparatus is shown in a schematic block diagram. In this optical information recording/reproducing apparatus, laser light 3 emitted from a nitride semiconductor laser device 1 is modulated by an optical modulator 4 in accordance with input information, and records the information on a disk 7 via a scan mirror 5 and a lens 6. Disk 7 is rotated by a motor 8. At the time of reproduction, reflected laser light optically modulated by bit arrangement on disk 7 is detected by a detector 10 via a beam splitter 9, and then a reproduced signal is obtained. The operations of the respective elements are controlled by a control circuit 11. The output of laser device 1 is normally on the order of 30 mW upon recording and on the order of 5 mW upon reproduction.

The laser device according to the present invention can be used not only for the above-described optical disk recording/reproducing apparatus, but also for a laser printer, a bar code reader, a projector including lasers of optical three primary colors (blue, green, read), and others.

Industrial Applicability

As described above, according to the present invention, it is possible to improve light-emitting lifetime and luminous intensity of a nitride semiconductor light emitting device and also to prevent occurrence of cracks therein.

What is claimed is:

1. A nitride semiconductor light emitting device chip, comprising:

a mask substrate (100) including a mask pattern formed on a main surface of a nitride semiconductor substrate (101), said mask pattern being formed of a growth inhibiting film suppressing epitaxial growth of a nitride semiconductor layer thereon, and there being a plurality of windows unprovided with said growth inhibiting film, there being at least two different widths as mask widths each between said windows adjacent to each other, and said mask pattern including a mask A group (MAG) and a mask B group (MBG), and said mask B groups being arranged on respective sides of said mask A group, and a mask A width in said mask A group being set wider than a mask B width in said mask B group;

a nitride semiconductor underlayer (102) covering said windows and said mask pattern; and a light emitting device structure having a light emitting layer (106) including a quantum well layer or a quantum well layer and a barrier layer in contact with the quantum well layer between an n type layer (103–105) and a p type layer (107–110) over said underlayer, a current-constricting portion (RS) formed above said mask A, as a region through which substantial electric current is introduced into said light emitting layer.

2. The nitride semiconductor light emitting device chip according to claim 1, wherein said current-constricting portion is formed more than 2 μm away from the center of mask A in its width direction.

3. The nitride semiconductor light emitting device chip according to claim 2, wherein said current-constricting portion is completely included in a region right above mask A.

4. The nitride semiconductor light emitting device chip according to claim 2, wherein said current-constricting portion is formed above a region across mask A and window A.

5. The nitride semiconductor light emitting device chip according to claim 1, wherein a window A width in a region of said mask A group is set narrower than a window B width in a region of said mask B group.

6. The nitride semiconductor light emitting device chip according to claim 1, wherein said mask A width is in a range of 10–20 μm, and a window A width is in a range of 2–10 μm.

7. The nitride semiconductor light emitting device chip according to claim 1, wherein said mask B width is in a range of 2–10 μm, and a window B width is in a range of 5–40 μm.

8. The nitride semiconductor light emitting device chip according to claim 1, wherein said mask A is formed in a stripe having a longitudinal direction in parallel with one of a <1-100> direction and a <11-20> direction of said nitride semiconductor substrate.

9. The nitride semiconductor light emitting device chip according to claim 1, wherein said mask B group includes masks B parallel to different directions which form a grid pattern.

10. The nitride semiconductor light emitting device chip according to claim 1, wherein said nitride semiconductor underlayer includes one of $Al_xGa_{1-x}N$ ($0.01 \leq x \leq 0.15$) and $In_xGa_{1-x}N$ ($0.01 \leq x \leq 0.18$).

11. The nitride semiconductor light emitting device chip according to claim 1, wherein said quantum well layer contains at least one of As, P and Sb.

12. The nitride semiconductor light emitting device chip according to claim 1, wherein said growth inhibiting film is a dielectric film.

13. An optical apparatus comprising the nitride semiconductor light emitting device chip of claim 1.

14. A nitride semiconductor laser chip, comprising:

a mask substrate including a mask group formed on a region of a main surface of a nitride semiconductor substrate (101) having a polarity of n type or p type, said mask group including a plurality of masks (200) and a plurality of windows arranged alternately, each said mask being formed of a growth inhibiting film suppressing epitaxial growth of a nitride semiconductor layer thereon, and each said window being unprovided with said growth inhibiting film;

a nitride semiconductor underlayer (102) having a polarity and covering the entire region of said mask substrate including said mask group; and a light emitting device structure having a light emitting layer (106) including a quantum well layer or a quantum well layer and a baffler layer in contact with the quantum well layer between an n type layer (103–105) and a p type layer (107–110) over said underlayer, a current-constricting portion (RS) formed above said mask group, as a region through which substantial electric current is introduced into said light emitting layer, electrodes (111, 112) being formed on a back side of said mask substrate and a front side of said light emitting device structure, respectively, and a width (MGW) of said mask group being narrower than a width (CW) of the laser chip in a direction orthogonal to a length direction of a laser resonator.

15. The nitride semiconductor laser chip according to claim 14, wherein in the width direction orthogonal to the length direction of the resonator of said laser chip, the width of said mask group is less than 50% of a width of said laser chip.

16. The nitride semiconductor laser chip according to claim 14, wherein said mask has width in a range of 10–20 $\mu$m, and said window has a width in a range of 2–10 $\mu$m.

17. The nitride semiconductor laser chip according to claim 14, wherein said current-constricting portion is formed above the mask located approximately at the center of said mask group.

18. The nitride semiconductor laser chip according to claim 14, wherein said current-constricting portion is formed above the mask located near a side edge of said mask group.

19. The nitride semiconductor laser chip according to claim 14, wherein said nitride semiconductor underlayer has a thickness of greater than 2 $\mu$m and less than 30 $\mu$m.

20. The nitride semiconductor laser chip according to claim 14, wherein said nitride semiconductor underlayer is GaN which contains at least one impurity selected from an impurity group of Si, O, Cl, S, C, Ge, Zn, Cd, Mg and Be in a range between $1 \times 10^{17}/cm^3$ and $8 \times 10^{18}/cm^3$.

21. The nitride semiconductor laser chip according to claim 14, wherein said nitride semiconductor underlayer includes one of $Al_xGa_{1-x}N$ ($0.01 \leq x \leq 0.15$) and $In_xGa_{1-x}N$ ($0.01 \leq x \leq 0.18$).

22. The nitride semiconductor laser chip according to claim 21, wherein an impurity concentration contained in said $Al_xGa_{1-x}N$ ($0.01 \leq x \leq 0.15$) is greater than $3 \times 10^{17}/cm^3$ and less than $8 \times 10^{18}/cm^3$, and an impurity concentration contained in said $In_xGa_{1-x}N$ ($0.01 \leq x \leq 0.18$) is greater than $1 \times 10^{17}/cm^3$ and less than $5 \times 10^{18}/cm^3$.

23. The nitride semiconductor laser chip according to claim 14, wherein said quantum well layer contains at least one of As, P and Sb.

24. An optical apparatus comprising the nitride semiconductor laser chip of claim 14.

* * * * *